(12) United States Patent
Nayaz Noemaun

(10) Patent No.: US 11,121,181 B2
(45) Date of Patent: Sep. 14, 2021

(54) DIMENSION CONTROL FOR RAISED LINES

(71) Applicant: Micron Technology, Inc., Boise, ID (US)

(72) Inventor: Ahmed Nayaz Noemaun, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/298,299

(22) Filed: Mar. 11, 2019

(65) Prior Publication Data

US 2020/0295082 A1 Sep. 17, 2020

(51) Int. Cl.
*H01L 27/24* (2006.01)
*H01L 45/00* (2006.01)
*H01L 27/11514* (2017.01)
*H01L 27/11507* (2017.01)

(52) U.S. Cl.
CPC ...... *H01L 27/249* (2013.01); *H01L 27/11507* (2013.01); *H01L 27/11514* (2013.01); *H01L 45/06* (2013.01); *H01L 45/085* (2013.01); *H01L 45/1233* (2013.01); *H01L 45/1253* (2013.01); *H01L 45/141* (2013.01); *H01L 45/1675* (2013.01)

(58) Field of Classification Search
CPC ............ H01L 23/528; H01L 29/66666; H01L 29/7827; H01L 45/06; H01L 27/249; H01L 45/1233; H01L 45/1675; H01L 45/141; H01L 45/1253; H01L 27/11514; H01L 45/085; H01L 27/11507; H01L 27/1052; H01L 27/2463

USPC .................................. 257/330, 4, E29.262
See application file for complete search history.

(56) References Cited

U.S. PATENT DOCUMENTS 9,299,747 B1 * 3/2016 Pellizzer ............... H01L 45/124
9,704,923 B1 7/2017 Bernhardt et al.
9,881,971 B2 1/2018 Lindenberg
9,923,139 B2 3/2018 Bernhardt et al.
2010/0047995 A1 2/2010 Apodaca et al.
2013/0137237 A1 5/2013 Ishibashi et al.
2013/0168634 A1 7/2013 Lee
(Continued)

OTHER PUBLICATIONS

ISA/KR, International Search Report and Written Opinion of the International Searching Authority, Int'l. Appl. No. PCT/US2020/018876, dated Jun. 29, 2020, Korean Intellectual Property Office, Seo-gu, Daejeon, Republic of Korea, 11 pgs.

*Primary Examiner* — Jonathan Han

(74) *Attorney, Agent, or Firm* — Holland & Hart LLP

(57) ABSTRACT

Methods, systems, and devices for dimension control for raised lines are described. For example, the techniques described herein may be used to fabricate raised lines (e.g., orthogonal raised lines). The lines may be fabricated such that an overall area of each line is consistent. In some examples, the techniques may be applied to form memory cells across multiple memory tiles, multiple memory arrays, and/or multiple wafers such that each memory cell comprises a consistent overall area. To form the lines and/or memory cells, a material associated with a desired properties may be deposited after performing a first cut. Due to the properties associated with the material, a width of the second cut may be affected, thus resulting in more uniform lines and/memory cells.

16 Claims, 15 Drawing Sheets

(56) References Cited

U.S. PATENT DOCUMENTS

| | | | |
|---|---|---|---|
| 2015/0069630 A1* | 3/2015 | Sciarrillo | H01L 45/1675 257/776 |
| 2015/0171321 A1* | 6/2015 | Chan | H01L 27/2481 257/4 |
| 2016/0049447 A1 | 2/2016 | Jung et al. | |

* cited by examiner

DIMENSION CONTROL FOR RAISED LINES

BACKGROUND

The following relates generally to forming a memory array and more specifically to dimension control for raised lines.

Memory devices are widely used to store information in various electronic devices such as computers, wireless communications devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may include volatile memory cells or non-volatile memory cells. Non-volatile memory cells may maintain their stored logic state for extended periods of time even in the absence of an external power source. Volatile memory cells may lose their stored state over time unless they are periodically refreshed by an external power source.

Forming memory devices and other devices (e.g., integrated circuits of any type) may include the formation of intersecting lines. Improved techniques for fabricating memory devices or other devices (e.g., faster, lower-cost) with uniform feature sizes or other beneficial features may be desired. Improving memory devices, generally, may include increasing memory cell density, increasing read/write speeds, increasing reliability, increasing data retention, reducing power consumption, or reducing manufacturing costs, among other metrics.

DETAILED DESCRIPTION

Figure 1:
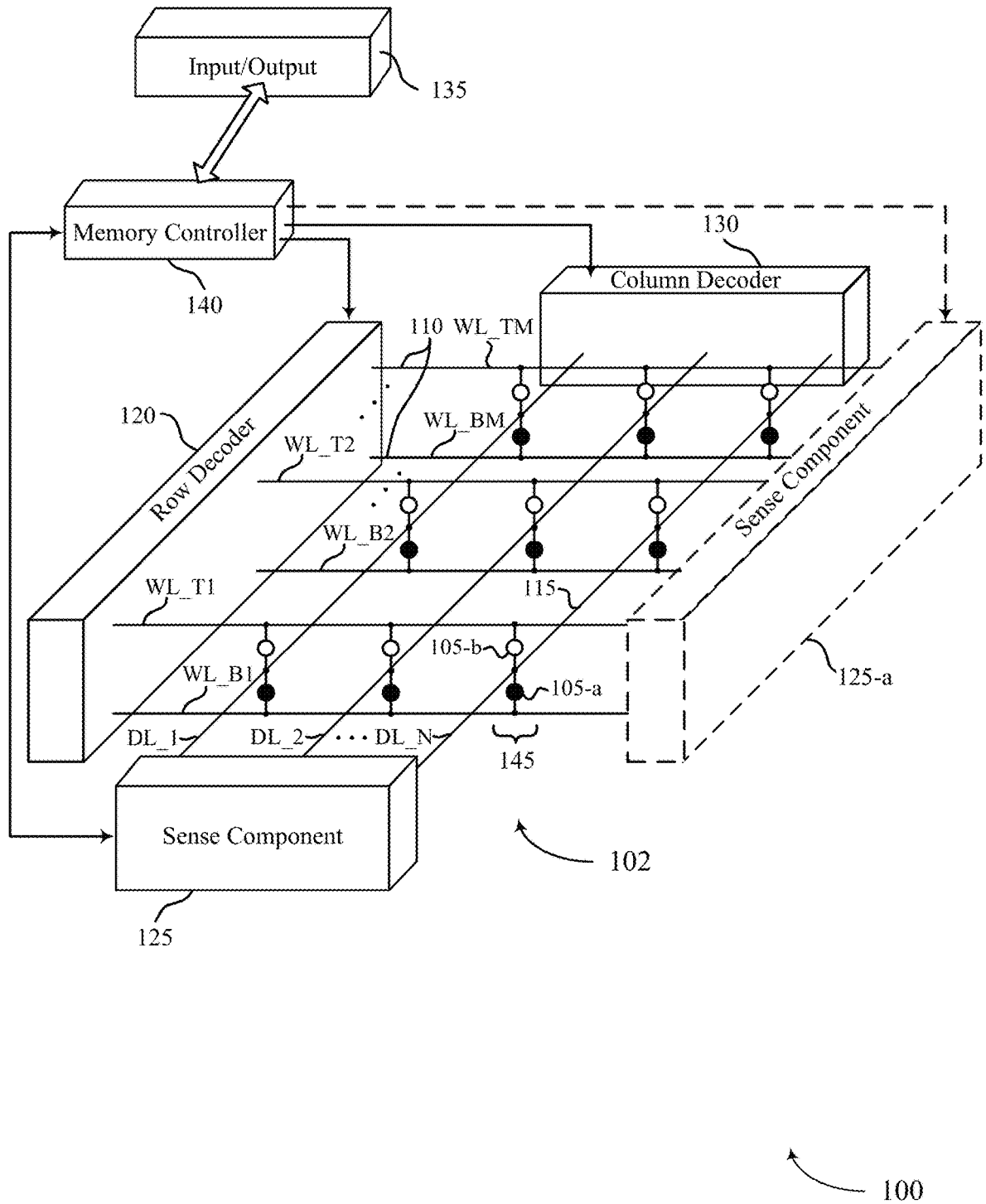
FIG. 1 illustrates an example memory device including a three-dimensional array of memory cells that supports dimension control for raised lines in accordance with examples as disclosed herein.

In some cases, the cross-sectional area of memory cells may vary from tile-to-tile, die-to-die, and/or wafer-to-wafer. The areas of each memory cell may vary due to patterning steps, such as orthogonal patterning steps, being performed separately, which may result in the lateral dimensions (e.g., a first dimension in the "X" direction and a second dimension in the "Y" direction) of each fabricated memory cell being independent (e.g., different) from another.

For example, to form an array of memory cells, a first cut may be made in a stack of materials to form first lines (e.g., first raised lines) extending in the first direction. Subsequently, a second cut (e.g., an orthogonal cut, a cut in a direction different than the first direction) may be made in the stack to form second lines extending in the second direction and, in turn, memory cells located at each intersection of the first and second lines. Each cut, however, may result in lines of varying width, which may ultimately result in each memory cell of an array having a different area. This problem may be further-exacerbated on a die-to-die or a wafer-to-wafer level due to larger quantities of memory cells being fabricated. Because electrical, thermal, and structural properties of memory cells are based on each cell's dimensions (e.g., its area), it may be advantageous to fabricate memory cells having more-uniform area. More-specifically, it may be advantageous to fabricate memory cells having a more-uniform area—on a tile-to-tile level, on a die-to-die level, and/or a wafer-to-wafer level—in order to increase yield and improve product quality and grade.

The fabrication techniques, methods, and related devices described herein may facilitate dimension control for raised lines, which may be included in a memory device (e.g., within array layers collectively including two or more decks of memory cells) or other type of integrated circuit, for example. As one example, the fabrication techniques may support various cross-point memory architectures, such as a quilt architecture or its derivatives. A quilt architecture in a context of a memory device may refer to an array of memory cells (e.g., 3D XPoint™ memory cells, FeRAM cells) that includes a set of memory tiles that each include similar configurations of components (e.g., word line decoders, bit line decoders, sense components, a subset of the array of memory cells) similar to the arrangement of patches in a patchwork quilt. The memory tiles may be considered as building blocks (e.g., modular building blocks) for the array of memory cells of the memory device employing the quilt architecture. In this manner, the array of memory cells of the memory device may be expanded or contracted by increasing or decreasing the number of memory tiles.

In other words, a cross-point architecture may refer to a memory array including topological cross-points of first access lines and second access lines, where each topological cross-point corresponds to a memory cell, and a quilt architecture may refer to constructing an array of memory cells by arranging a set of memory tiles that each form a subset of the array. Generally, though described with reference to the example of a memory device, the fabrication techniques described herein may support the fabrication of any integrated circuit (e.g., memory devices of any architecture) or other device in which orthogonal lines are desired.

In some cases, the fabrication techniques described herein may form a plurality of first raised lines in a stack of materials. The stack of materials may include a conductive material, a memory cell material, and/or a hardmask material. In some examples, the plurality of first raised lines may each have a respective width. The width of each first raised line may be the same or, in some examples, may vary from raised line to raised line (e.g., due to variations or imperfections in fabrication processes or environmental conditions). For example, each of the first raised lines may vary in width (e.g., in thickness). Because the first raised lines may be formed on a memory tile, a memory die, or on multiple memory dies on a wafer, the dimensions of the first raised lines may vary from tile-to-tile, die-to-die, or wafer-to-wafer.

After forming the plurality of first raised lines, a dielectric material may be deposited between the lines. A polishing step may then occur, which may remove a hardmask material associated with forming the plurality of first raised lines (e.g., used as a mask for forming the plurality of first raised lines) and may also remove at least a portion of the dielectric material, which may result in a recess located between each of the first raised lines. After the polishing, a material (e.g., a conductive material) may be deposited over the dielectric. Stated another way, the material may be deposited over a top surface of the memory cell material of each raised line.

The material may be selected based on its conductive properties (e.g., thermally-conductive properties, electrically-conductive properties) and/or an etch rate associated with the material. By selecting a material having an associated etch rate that is slower than an etch rate of the other materials in the stack, a width of second lines subsequently formed may be influenced. For example, thinner first lines may result in a greater gap (separation) between each respective line and, in turn, more material located between the lines. Thus when performing a second cut to form second raised lines, the additional material may take longer to etch and, as a result, may result in a lesser gap (separation) between each respective second line (e.g., thicker second lines). (Conversely, thicker (wider) first lines may result in a smaller gap (separation) between each respective line and, in turn, less material located between the lines, which may result in a greater gap (separation) between each respective second line and thus thinner second lines.) Accordingly, thinner first lines may result in wider second lines and vice versa. By employing this fabrication technique on a tile-to-tile level, a die-to-die level, and/or a wafer-to-wafer level (e.g., depositing the material after forming first raised lines), each second cut may be influenced by the presence of the material. The end result may be memory cells having a more-uniform area, which may result in increased yield during production, as well as improved product quality and grade.

Features of the disclosure introduced above are further described herein in the context of constructing 3D memory devices. Specific examples of structures and techniques for dimension control for raised lines are then described. These and other features of the disclosure are further illustrated by and described with reference to apparatus diagrams, method of formation diagrams, and flowcharts that relate to dimension control for raised lines.

FIG. 1 illustrates an example memory device 100 including a three-dimensional array of memory cells that supports dimension control for raised lines in accordance with examples of the present disclosure. Memory device 100 may also be referred to as an electronic memory apparatus. FIG. 1 is an illustrative representation of various components and features of the memory device 100. As such, it should be appreciated that the components and features of the memory device 100 are shown to illustrate functional interrelationships, not their actual physical positions within the memory device 100.

In the illustrative example of FIG. 1, the memory device 100 includes a three-dimensional (3D) memory array 102, though the teachings herein may also be used to form a 2D (single deck) memory array (among other device types). The 3D memory array 102 includes memory cells 105 that may be programmable to store different states. In some examples, each memory cell 105 may be programmable to store two states, denoted as a logic 0 and a logic 1. In some examples, a memory cell 105 may be configured to store more than two logic states (e.g., a multi-level cell). A memory cell 105 may, in some examples, include various types of memory cells— e.g., a self-selecting memory cell, a 3D XPoint™ memory cell, a PCM cell that includes a storage component and a selection component, a conductive-bridge RAM (CBRAM) cell, or a FeRAM cell. Although some elements included in FIG. 1 are labeled with a numeric indicator, other corresponding elements are not labeled, though they are the same or would be understood to be similar, in an effort to increase the visibility and clarity of the depicted features.

The 3D memory array 102 may include two or more two-dimensional (2D) memory arrays formed on top of one another (e.g., array layers including two or more decks of memory cells and array electrodes). This may increase a number of memory cells that may be placed or created on a single die or substrate as compared with a single 2D array, which in turn may reduce production costs, or increase the performance of the memory device, or both. In the example depicted in FIG. 1, the 3D memory array 102 includes two levels of memory cells 105 (e.g., memory cell 105-*a* and memory cell 105-*b*); however, the number of levels may not be limited to two, and other examples may include additional levels (e.g., 4 levels, 8 levels, 16 levels, 32 levels). Each level may be aligned or positioned so that memory cells 105 may be aligned (exactly, overlapping, or approximately) with one another across each level, thus forming memory cell stacks 145. In some cases, levels of memory cells may be referred to as decks of memory cells.

In some examples, each row of memory cells 105 is connected to a word line 110, and each column of memory cells 105 is connected to a bit line 115. Both word lines 110 and bit lines 115 may also be generically referred to as access lines. Further, an access line may function as a word line 110 for one or more memory cells 105 at one deck of the memory device 100 (e.g., for memory cells 105 below the access line) and as a bit line 115 for one or more memory cells 105 at another deck of the memory device (e.g., for memory cells 105 above the access line). Thus, references to word lines and bit lines, or their analogues, are interchangeable without loss of understanding or operation. Word lines 110 and bit lines 115 may be substantially perpendicular to one another and may support an array of memory cells.

In general, one memory cell 105 may be located at the intersection of two access lines such as a word line 110 and a bit line 115. This intersection may be referred to as the address of the memory cell 105. A target memory cell 105 may be a memory cell 105 located at the intersection of an energized (e.g., activated) word line 110 and an energized (e.g., activated) bit line 115; that is, a word line 110 and a bit line 115 may both be energized in order to read or write a memory cell 105 at their intersection. Other memory cells 105 that are in electronic communication with (e.g., connected to, coupled with) the same word line 110 or bit line 115 may be referred to as untargeted memory cells 105.

As shown in FIG. 1, the two memory cells 105 in a memory cell stack 145 may share a common conductive line such as a bit line 115. That is, a bit line 115 may be coupled with the upper memory cell 105-*b* and the lower memory cell 105-*a*. Other configurations may be possible, for example, a third layer (not shown) may share a word line 110 with the upper memory cell 105-*b*.

In some cases, an electrode may couple a memory cell 105 to a word line 110 or a bit line 115. The term electrode may refer to an electrical conductor, and may include a trace, wire, conductive line, conductive layer, or the like that provides a conductive path between elements or components of memory device 100. Thus, the term electrode may refer in some cases to an access line, such as a word line 110 or a bit line 115, as well as in some cases to an additional conductive element employed as an electrical contact between an access line and a memory cell 105. In some examples, a memory cell 105 may comprise a chalcogenide material positioned between a first electrode and a second electrode. The first electrode may couple the chalcogenide material to a word line 110, and the second electrode couple the chalcogenide material with a bit line 115. The first electrode and the second electrode may be the same material (e.g., carbon) or different material. In other examples, a memory cell 105 may be coupled directly with one or more access lines, and electrodes other than the access lines may be omitted.

Operations such as reading and writing may be performed on memory cells 105 by activating or selecting word line 110 and bit line 115. Activating or selecting a word line 110 or a bit line 115 may include applying a voltage to the respective line. Word lines 110 and bit lines 115 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

In some architectures, the logic storing device of a cell (e.g., a resistive component in a CBRAM cell, a capacitive component in a FeRAM cell) may be electrically isolated from the bit line by a selection component. The word line 110 may be connected to and may control the selection component. For example, the selection component may be a transistor and the word line 110 may be connected to the gate of the transistor. Alternatively, the selection component may be a variable resistance component, which may include chalcogenide material. Activating the word line 110 may result in an electrical connection or closed circuit between the logic storing device of the memory cell 105 and its corresponding bit line 115. The bit line may then be accessed to either read or write the memory cell 105. Upon selecting a memory cell 105, the resulting signal may be used to determine the stored logic state. In some cases, a first logic state may correspond to no current or a negligibly small current through the memory cell 105, whereas a second logic state may correspond to a finite current.

In some cases, a memory cell 105 may include a self-selecting memory cell having two terminals and a separate selection component may be omitted. As such, one terminal of the self-selecting memory cell may be electrically connected to a word line 110 and the other terminal of the self-selecting memory cell may be electrically connected to a bit line 115.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 may receive a column address from the memory controller 140 and activate the appropriate bit line 115. For example, the 3D memory array 102 may include multiple word lines 110, labeled WL_1 through WL_M, and multiple bit lines 115, labeled DL_1 through DL_N, where M and N depend on the array size. Thus, by activating a word line 110 and a bit line 115, e.g., WL_2 and DL_3, the memory cell 105 at their intersection may be accessed.

Upon accessing, a memory cell 105 may be read, or sensed, by sense component 125 to determine the stored state of the memory cell 105. For example, a voltage may be applied to a memory cell 105 (using the corresponding word line 110 and bit line 115) and the presence of a resulting current through the memory cell 105 may depend on the applied voltage and the threshold voltage of the memory cell 105. In some cases, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected. In other cases, predetermined voltages may be applied sequentially until a current is detected. Likewise, a current may be applied to a memory cell 105 and the magnitude of the voltage to create the current may depend on the electrical resistance or the threshold voltage of the memory cell 105. In some examples, sense component 125 may read information stored in a selected memory cell 105 by detecting the current flow or lack thereof through the memory cell 105.

Sense component 125 may include various transistors or amplifiers in order to detect and amplify a difference in the signals associated with a sensed memory cell 105, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. FIG. 1 also shows an alternative option of arranging sense component 125-a (in a dashed box). An ordinary person skilled in the art would appreciate that sense component 125 may be associated either with column decoder or row decoder without losing its functional purposes.

A memory cell 105 may be set or written by similarly activating the relevant word line 110 and bit line 115, and at least one logic value may be stored in the memory cell 105. Column decoder 130 or row decoder 120 may accept data, for example input/output 135, to be written to the memory cells 105.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state, so the logic state may be re-written after a sense operation. Additionally, in some memory architectures, activating a single word line 110 may result in the discharge of all memory cells in the row (e.g., coupled with the word line 110); thus, several or all memory cells 105 in the row may need to be re-written. But in non-volatile memory, such as self-selecting memory, PCM, CBRAM, FeRAM, or not-AND (NAND) memory, accessing the memory cell 105 may not destroy the logic state and, thus, the memory cell 105 may not require re-writing after accessing.

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and bit line 115. Memory controller 140 may also generate and control various voltages or currents used during the operation of memory device 100. In general, the amplitude, shape, polarity, and/or duration of an applied voltage or current discussed herein may be adjusted or varied and may be different for the various operations discussed in operating the memory device 100. Further, one, multiple, or all memory cells 105 within the 3D memory array 102 may be accessed simultaneously; for example, multiple or all cells of the 3D memory array 102 may be accessed simultaneously during a reset operation in which all memory cells 105, or a group of memory cells 105, are set to a single logic state.

The 3D memory array 102 may be positioned above a substrate that includes various circuitry, such as the row decoder 120, the sense component 125, the column decoder 130, or the like. In some cases, the 3D memory array 102 may include one or more memory cells 105 that are formed using the fabrication techniques described herein. For example, a stack of materials that includes one or more conductive materials and a memory cell material may be cut in a first direction to form a first plurality of raised lines. The stack may subsequently be cut in a second direction (e.g., in an orthogonal direction) to form a second plurality of raised lines. The structure formed by the cut in the second direction may be or may be referred to as a pillar structure, and may include the memory cell 105 coupled with a word line 110 and a bit line 115 (e.g., the conductive material(s)). During the fabrication process, and during a time between the first cut and the second cut, a material may be deposited over the memory cell material. Based on certain properties of the material (e.g., based on an etch rate associated with the material), a width of the second cut may be influenced based on a width of the first cut. For example, if the first cut produced a relatively thick first raised line, the presence of the material may result in a respective second raised line being relatively thin (e.g., narrow), and vice versa. Thus the presence of the material may, in turn, affect an area of each memory cell 105 of the 3D memory array 102. Stated another way, the fabrication techniques described herein may result in the memory cells 105 of the 3D memory array 102 having a uniform area.

Figure 2:
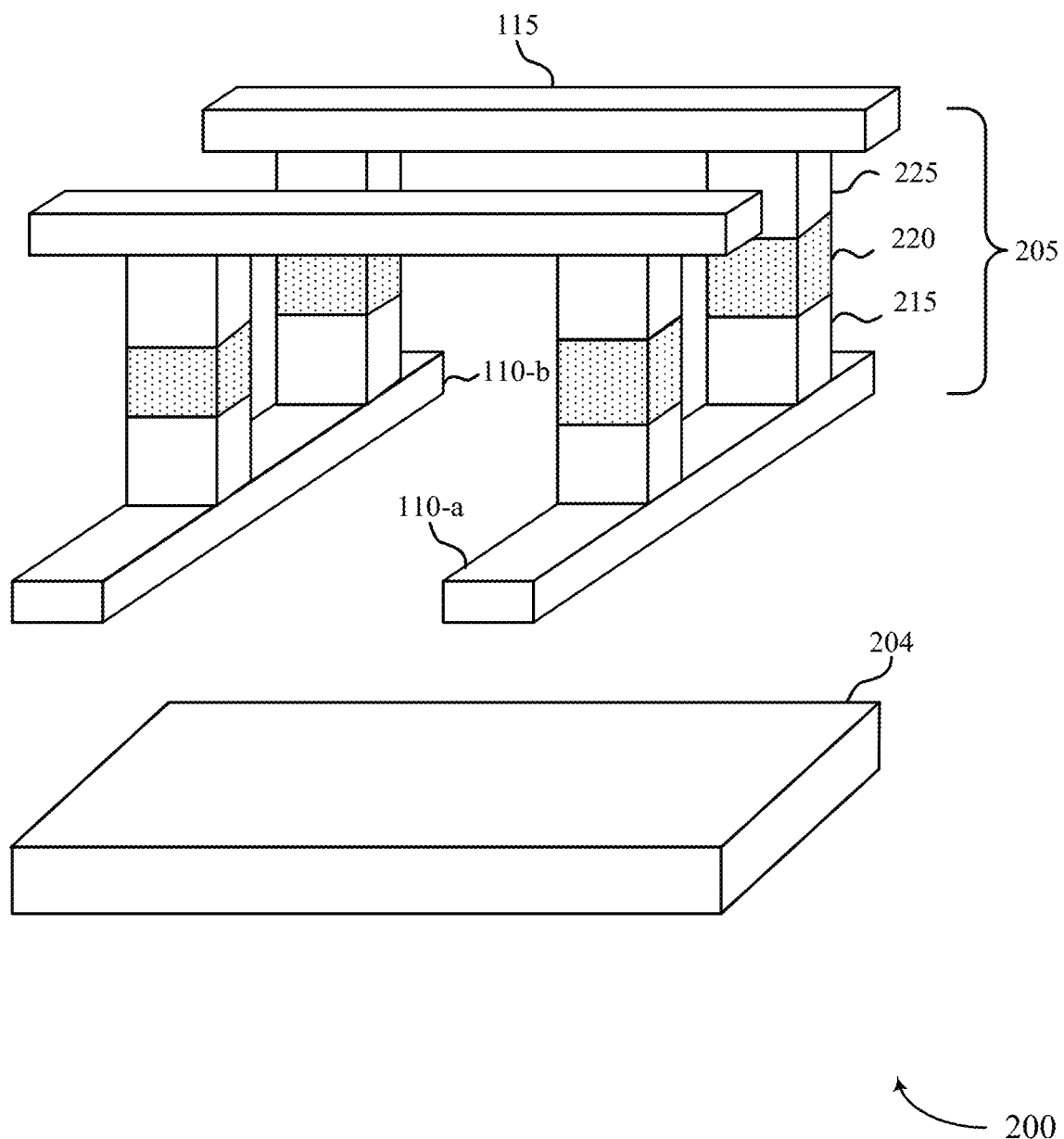
FIG. 2 illustrates an example of a three-dimensional memory array that supports dimension control for raised lines in accordance with examples as disclosed herein.

FIG. 2 illustrates an example of a memory array 200 that supports dimension control for raised lines in accordance with examples of the present disclosure. The memory array 200 may be an example of portions of memory array 102 described with reference to FIG. 1. In some examples, multiple instances of the memory array 200 may be replicated (e.g., formed and stacked on top of one another) to form a 3D memory device. The 3D memory device may include two or more decks of memory cells. The memory array 200 may include a deck 205 of memory cells (e.g., a first deck of memory cells) that is positioned above a substrate 204. In the case of a 3D memory array (not shown), the memory array 200 may include a second array or deck of memory cells on top of the first array or deck 205. The memory array 200 may also include word line 110-a, word line 110-b, and bit line 115, which may be examples of word lines 110 and a bit line 115 as described with reference to FIG. 1.

As in the illustrative example depicted in FIG. 2, memory cells of the deck 205 may include a self-selecting memory cell. In some examples, memory cells of the deck 205 may include another type of memory cell that may be suitable for a cross-point architecture—e.g., a CBRAM cell, a 3D XPoint™ cell, an FeRAM cell. For example, the memory cells of the deck 205 (or of additional decks in the case of a 3D memory array) may include an additional selection component (e.g., a transistor or separate chalcogenide element configured for selection functionality). Although some elements included in FIG. 2 are labeled with a numeric indicator, other corresponding elements are not labeled, though they are the same or would be understood to be similar, in an effort to increase the visibility and clarity of the depicted features.

In some cases, memory cells of the deck 205 may each include first electrode 215, chalcogenide material 220, and second electrode 225. As used herein, materials included in a cell stack between a word line 110 and a bit line 115 may be considered as included in a memory cell and referred to collectively or individually as memory cell material. For example, as described below with reference to FIGS. 3A through 3L, a memory cell material (e.g., memory cell material 315) may be understood as a composite (heterogenous, mixed, amalgamated) material and may include distinct materials included in a first electrode 215, a chalcogenide material 220, and/or a second electrode 225. In the context of a memory cell material, an etch rate may refer to an etch rate of any one material included in the memory cell material 315 (e.g., a slowest-etching or most etch-rate-limiting material included in the memory cell material 315) or an average or otherwise blended etch rate of the materials included in the memory cell material 315. In some cases, a combination of various materials (e.g., first electrode 215, chalcogenide material 220, second electrode 225) that may form a memory cell (e.g., memory cell 105-a, memory cell 105-b) may also be collectively referred to as a memory cell stack.

In some examples, access lines (e.g., word line 110, bit line 115) may include an electrode layer (e.g., a conformal layer), in lieu of electrodes 215 or 225 and thus may comprise multi-layered access lines. In such examples, the electrode layer of the access lines may interface with a memory material (e.g., chalcogenide material 220). In some examples, access lines (e.g., word line 110, bit line 115) may directly interface with a memory material (e.g., chalcogenide material 220) without an electrode layer or an electrode in-between.

The memory cells of the deck 205 may, in some examples, have common conductive lines such that corresponding pillars may share bit lines 115 or word lines 110. For example, the electrode 225 and a top electrode of an adjacent pillar may both be coupled to bit line 115 such that bit line 115 is shared by adjacent memory cells (in an x-direction).

In some examples, the memory array 200 may include an additional deck or additional decks of memory cells stacked on the deck 205. Each additional deck of memory cells may be aligned (e.g., vertically aligned in a y-direction) and may include an additional bit line. For example, an additional deck of memory cells may be coupled with the deck 205 such that a bottom electrode is coupled with the bit line 115 and a top electrode is coupled with the additional bit line. The additional bit line may be electrically isolated from the bit line 115 (e.g., an insulating material may be interposed between the additional bit line and the bit line 115). As a result, the first deck 205 and each additional deck may be separated and may operate independently of each other. In some cases, an access line (e.g., either word line 110 or bit line 115) may include a selection component (e.g., a two-terminal selector device, which may be configured as one or more thin-film materials integrated with the access line) for a respective memory cell at each cross-point. As such, the access line and the selection component may together form a composite layer of materials functioning as both an access line and a selection component.

The architecture of the memory array 200 may in some cases be referred to as an example of a cross-point architecture, as a memory cell may be formed at a topological cross-point between a word line 110 and a bit line 115 as illustrated in FIG. 2. Such a cross-point architecture may offer relatively high-density data storage with lower production costs compared to some other memory architectures. For example, a memory array with a cross-point architecture may have memory cells with a reduced area and, resultantly, may support an increased memory cell density compared to some other architectures. For example, a cross-point architecture may have a $4F^2$ memory cell area, where F is the smallest feature size (e.g., a minimum feature size), compared to other architectures with a $6F^2$ memory cell area, such as those with a three-terminal selection component. For example, a DRAM memory array may use a transistor (e.g., a thin-film transistor), which is a three-terminal device, as the selection component for each memory cell, and thus a DRAM memory array comprising a given number of memory cells may have a larger memory cell area compared to a memory array with a cross-point architecture comprising the same number of memory cells.

While the example of FIG. 2 shows a single memory deck 205, other configurations may include any number of decks (e.g., 2 decks, 4 decks, 8 decks, 16 decks, 32 decks). In some examples, one or more of the memory decks may include self-selecting memory cells that include chalcogenide material 220. In other examples, one or more of the memory decks may include FeRAM cells that include a ferroelectric material. In yet another examples, one or more of the memory decks may include a PCM cell that includes a storage component and a selection component. Chalcogenide materials 220 may, for example, include a chalcogenide glass such as, for example, an alloy of selenium (Se), tellurium (Te), arsenic (As), antimony (Sb), carbon (C), germanium (Ge), and silicon (Si). In some example, a chalcogenide material having primarily selenium (Se), arsenic (As), and germanium (Ge) may be referred to as SAG-alloy. In some cases, word line 110-*a*, word line 110-*b*, and bit line 115 of the memory array 200 may be referred to as access lines or array electrodes.

In some cases, a deck (e.g., the deck 205) of a memory device may be formed using the fabrication techniques described herein. For example, the memory array 200 may be formed using one or more fabrication techniques as described with reference to FIGS. 3A-3L. In some examples, the memory array 200 may be or may include a first pillar that includes a first memory cell coupled with a first conductive line (e.g., word line 110-*a*) and a second conductive line (e.g., bit line 115). In some examples, the memory array 200 may include a second pillar that includes a second memory cell coupled with the second conductive line (e.g., bit line 115) and a third conductive line (e.g., word line 110-*b*). Due to the fabrication techniques employed to form the first pillar and the second pillar, the memory array 200 may include a second conductive material (e.g., a second conductive material 340 as described with reference to FIGS. 3D-3L) that is located below the second conductive line. At least a portion of the second conductive material may extend below an upper surface of the first pillar and an upper surface of the second pillar, and may be located between a portion of each of the pillars. As described herein, the presence of the second conductive material may allow for memory cells having a more-uniform area to be fabricated across multiple tiles within a memory die, multiple memory dies, and/or multiple wafers.

FIGS. 3A-3L illustrate example fabrication techniques that support dimension control for raised lines in accordance with examples of the present disclosure. FIGS. 3A-3L describe aspects of several process steps for forming an array of memory cells (e.g., memory array 200 as described with reference to FIG. 2). In some cases, the memory array may be formed by performing a first cut (e.g., a first etch) in a first direction and subsequently performing a second cut (e.g., a second etch) in a second direction (e.g., in an orthogonal or other intersecting, non-parallel direction). The resulting structure may include multiple pillars that each include a memory cell. Each pillar may be coupled with multiple access lines (e.g., a word line 110-*b* and a bit line 115 as described with reference to FIG. 2) and, as described herein, may include a PCM cell, a CBRAM cell, or a FeRAM cell. Stated another way, deposition of the material 340 may influence a width of the second cut based on a width of the first cut. Due to a material (e.g., material 340) being deposited between the first cut and the second cut, the area of each memory cell across multiple memory tiles, multiple memory dies, and/or multiple wafers may be substantially uniform.

As an illustrative example, FIGS. 3A-3L include cross-sectional views of a portion of a single deck (e.g., a first deck 205 including memory cell stacks and access lines as described with reference to FIG. 2) to illustrate aspects of features during several process steps for forming raised lines in accordance with examples of the present disclosure. A person of ordinary skill in the art would appreciate that the techniques described herein are not limited to a single deck (e.g., a single deck of memory cells). For example, the processing steps described herein may be used to form two or more decks of memory cells. Further, such a person of ordinary skill in the art would appreciate that a particular implementation of forming the raised lines (e.g., the first raised lines and the second raised lines) is not limiting. For example, any processing techniques requiring orthogonal or otherwise intersecting cuts may employ the techniques and processes described herein.

Figure 3A:
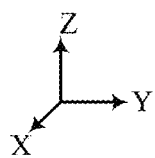
FIGS. 3A through 3L illustrate example fabrication techniques that support dimension control for raised lines in accordance with aspects of the present disclosure.
Figure 3A:
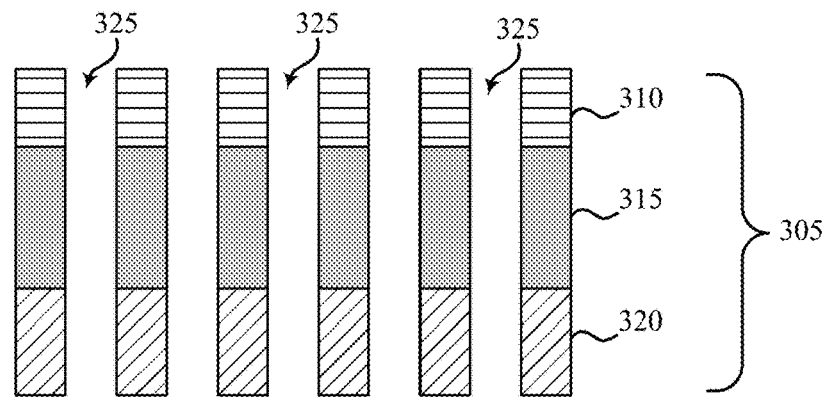

In FIG. 3A, a first processing step for forming raised lines is shown. In the processing step shown in FIG. 3A, a stack of materials may have been previously formed (not shown). The stack may include a hardmask material 310, a memory cell material 315, and a first conductive material 320. As described herein, the memory cell material 315 may be or may represent a PCM cell, a CBRAM cell, or a FeRAM cell. The memory cell material may include one or more electrodes (e.g., first electrode 215, second electrode 225 as described with reference to FIG. 2) and a chalcogenide material (e.g., chalcogenide material 220 as described with reference to FIG. 2). The memory cell material 315 may be understood as a composite (heterogenous, mixed, amalgamated) material and may include distinct materials included in an electrode and/or chalcogenide material. In some examples, the memory cell material 315 may include one or more electrodes (e.g., electrode 215 and electrode 225 as described with reference to FIG. 2) and a chalcogenide material (e.g., chalcogenide material 220 as described with reference to FIG. 2). Additionally or alternatively, the first conductive material 320 may be or may include one or more conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

As shown in FIG. 3A, a removal of material in a first direction (e.g., a first cut, creating gaps extending in an "X" direction) may occur. The first cut may result in a plurality of raised lines 305 being formed. In some examples, the plurality of raised lines 305 may be referred to as first raised lines 305 (e.g., a plurality of first raised lines 305) and may each extend in the first direction (e.g., in the "X" direction) with a width in a second direction (a "Y" direction) and a height in a third direction (a "Z" direction). Each of the plurality of raised lines 305 may extend parallel to each other in at least one direction and may be separated by a channel (gap) 325. For example, the raised lines 305 may extend parallel to each other in the first direction. Each channel 325 may likewise extend in the first direction. Stated another way, each channel 325 may result from the first cut.

In some examples, process variations or other factors related to the removal of material in the first direction may result in each portion of memory cell material 315 having a varying dimension in the second direction (e.g., a width of raised lines including memory cell material 315 may vary from line to line, and thus a gap between raised lines including memory cell material 315 may likewise vary from gap to gap). Despite each memory cell material 315 having a substantially similar dimension in the first and third directions (e.g., in the "X" and "Z" directions), the dimension (width) of the memory cell material 315 in the second direction (e.g., in the "Y" direction) may be undesirably large or undesirably small when compared with similar first cuts within the same memory tile and/or when compared with first cuts from different dies or wafers. However, as described herein, a second removal of material (e.g., a second cut) that is based on the first cut may compensate for undesirably large or undesirably small dimensions, and may result in memory cells having more uniform areas across multiple tiles, multiple dies, and/or multiple wafers.

Figure 3B:
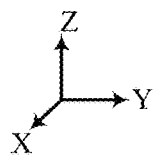
Figure 3B:
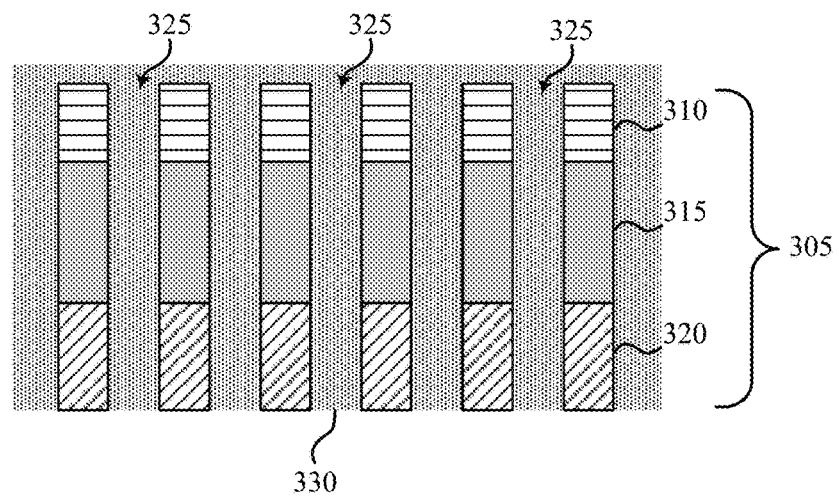

In FIG. 3B, a second processing step for forming raised lines is shown. In the processing step shown in FIG. 3B, a dielectric material 330 may be deposited between each of the plurality of raised lines 305 (i.e., the dielectric material 330 may be deposited in each channel 325 as described with reference to FIG. 3A). In some examples, the dielectric material 330 may be deposited such that it fills the channels 325 and thus maintains a substantially same thickness between at least a portion of each raised line 305. The dielectric material 330, upon being deposited, may be located at the bottom of the channels 325, above the hardmask material 310 and/or along the exterior sidewall of the hardmask material 310, the memory cell material 315, and the conductive material 320. In some examples, the dielectric material 330 may isolate each raised line 305.

Figure 3C:
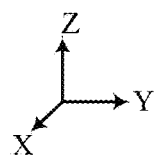
Figure 3C:
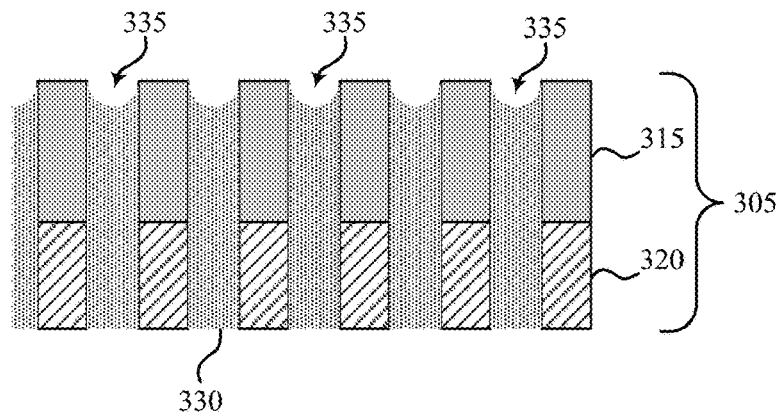

In FIG. 3C, a third processing step for forming raised lines is shown. In the processing step shown in FIG. 3C, the hardmask material 310 may be removed from each raised line 305. Additionally or alternatively, a portion of the dielectric material 330 may be removed from above and/or adjacent to each raised line 305 (e.g., from a portion of each channel 325 as described with reference to FIGS. 3A and 3B). In some examples, the hardmask material 310 and/or the dielectric material 330 may be removed using a polishing technique, such as a chemical-mechanical planarization (CMP) process step. The CMP or other process used to remove the hardmask material 310 may continue until the memory cell material 315 is exposed. Further, the CMP or other process used to remove the hardmask material 310 may remove the dielectric material 330 at a faster rate than the memory cell material (e.g., due to the dielectric material 330 being softer than the memory cell material 315, due to the dielectric material 330 having a different chemical composition than the memory cell material 315, or both), which may result in undesired features or defects, which may in some cases arise during or otherwise impact subsequent processing steps.

For example, the polishing process step may create a recess 335 between each raised line 305 (which may be referred to as dishing). The recess may be attributed, at least partially, to an absence of the memory cell material 315 between raised lines 305. Stated another way, the recesses 335 may be formed in and may be caused by the channels 325 between each raised line 305 having been filled with the dielectric material 330 and a difference in hardness or other properties of the dielectric material 330 relative to the memory cell material 315.

In some examples, the recesses 335 may be described as having a generally curved upper surface. For example, a top surface of each recess may be curved (e.g., rounded) and may extend in a linear direction parallel to the raised lines 305 (e.g., in the "X" direction) for the length of the stack of materials. Additionally or alternatively, the recesses 335 may also be described as being generally scallop-shaped, barrel shaped, gutter-shaped, concave, semi-cylindrical, and/or semi-circular. Due to the nature of the curved surface of each recess 335, the material 340 may conform to the shape of each recess 335. Stated another way, the material 340 may be generally curved (e.g., scallop-shaped, barrel shaped, concave, and/or semi-circular shaped) such that a lower surface of the material 340 is in contact with an upper surface of each recess 335.

Figure 3D:
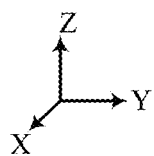
Figure 3D:
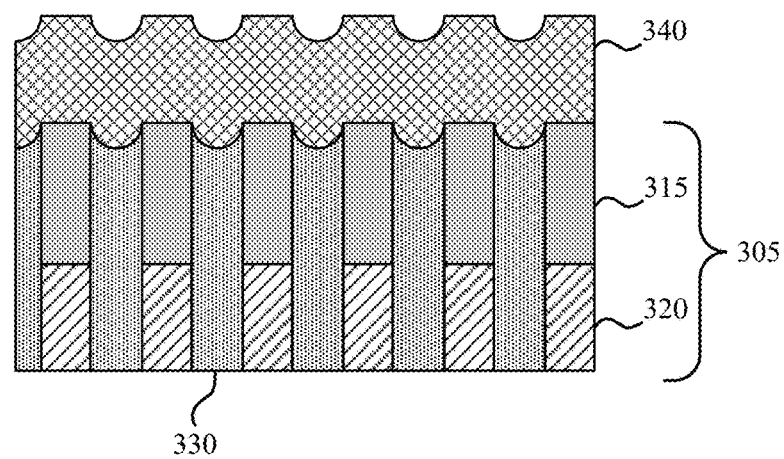

In FIG. 3D, a fourth processing step for forming raised lines is shown. In the processing step shown in FIG. 3D, a material 340 may be deposited over each of the plurality of raised lines 305. Due to the recesses 335 formed during the processing step described with reference to FIG. 3C, the material 340 may be deposited both over each of the plurality of raised lines 305 and within each of the recesses 335. Stated another way, the material 340 may be deposited within the curvature of each recess 335 such that the material 340 is in contact with a top surface of the dielectric material 330. Due to the curved shape of each recess 335, protrusions (lobes, dips) may occur along the bottom surface of the material 340 and dishing (recesses) may occur along the top surface of the material 340.

In some examples, the material 340 may be selected based on its resistance to an etch process used for the second cut (e.g., based on an associated etch rate) and/or one or more conductive properties. For example, in subsequent processing steps described herein, a portion of the material 340 may be located between the memory cell material 315 and a second conductive material (not shown; e.g., a bit line). Accordingly, it may be desirable for the material 340 to be at least electrically conductive in order to couple the memory cell material 315 of each raised line 305 with the second conductive material (e.g., with the bit line). Additionally or alternatively, depending on the composition of the memory cell material 315, it may be desirable for the material 340 to be a thermally conductive material. For example, the memory cell material 315 may include a PCM material. The PCM material may exist in a more-crystalline or a more-amorphous state based on a duration with which heat is applied and removed. Accordingly, in such examples, it may be advantageous for the material 340 to possess thermally-conductive properties.

Additionally or alternatively, it may be beneficial to select the material 340 based on the chemistry of the material relative to the chemistry of an etchant used in a subsequent processing step. For example, the material 340 may be selected such that it may be etched slower (e.g., substantially slower) than the other materials in the stack (e.g., slower than the memory cell material 315) during the second cut in the second direction. Accordingly, in subsequent processing steps as described herein, the etch rate associated with the material 340 may affect one or more dimensions during a second removal of material (e.g., during a second cut).

Figure 3E:
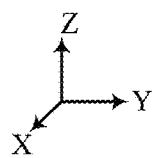
Figure 3E:
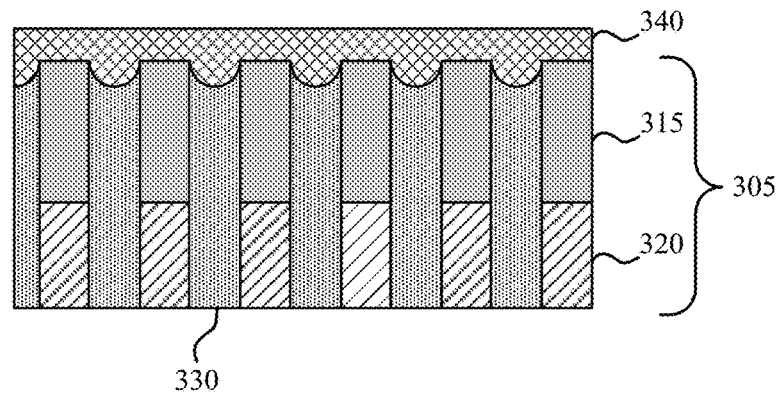

In FIG. 3E, a fifth processing step for forming raised lines is shown. In the processing step shown in FIG. 3E, a portion of the material 340 may be removed from above each raised line 305. As a result, at least a portion of the material 340 may remain above a top surface of the memory cell material 315. As described herein, it may be desirable for the material 340 to possess electrically and/or thermally-conductive properties when a portion of the material remains above a top surface of the memory cell material 315 (e.g., as shown in FIG. 3E). In some examples, the material 340 may be removed using a polishing technique, such as a CMP process step. As a result of the polishing, an upper surface of the material 340 may be substantially planar.

Figure 3F:
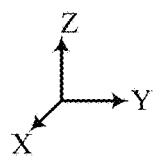
Figure 3F:
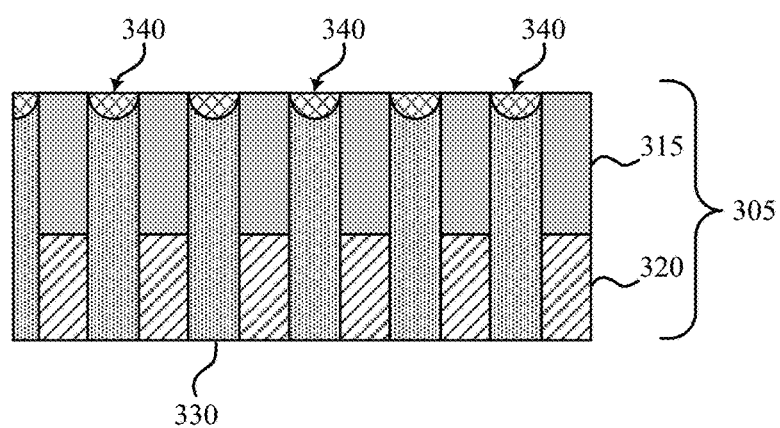

In FIG. 3F, an alternative fifth processing step for forming raised lines is shown. In the processing step shown in FIG. 3F, a portion of the material 340 may be removed from above each raised line 305. Removal of the material 340 may proceed until the memory cell material 315 is exposed. As a result, a top surface of the material 340 may be co-planar with a top surface of the memory cell material 315. Stated another way, a portion of the material 340 may be removed until the top surface of the material 340 and the top surface of the memory cell material 315 are level. In some examples, the material 340 may be removed using a polishing technique, such as a CMP process step.

As described herein, it may be desirable for the material 340 to possess electrically and/or thermally-conductive properties when a portion of the material 340 remains above a top surface of the memory cell material 315 (e.g., as shown in FIG. 3E). However, as shown in FIG. 3F, no portion of the material 340 remains above the memory cell material 315. Accordingly, when a second conductive material (e.g., from which bit lines may be formed) is later deposited, the second conductive material may be coupled directly with the memory cell material 315. Thus, the material 340 depicted in FIG. 3F need not be electrically conductive (though it may be), but rather may be a material such as a dielectric material. In some examples, however, the material 340 may be a thermally-conductive material.

Figure 3G:
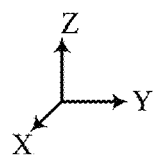
Figure 3G:
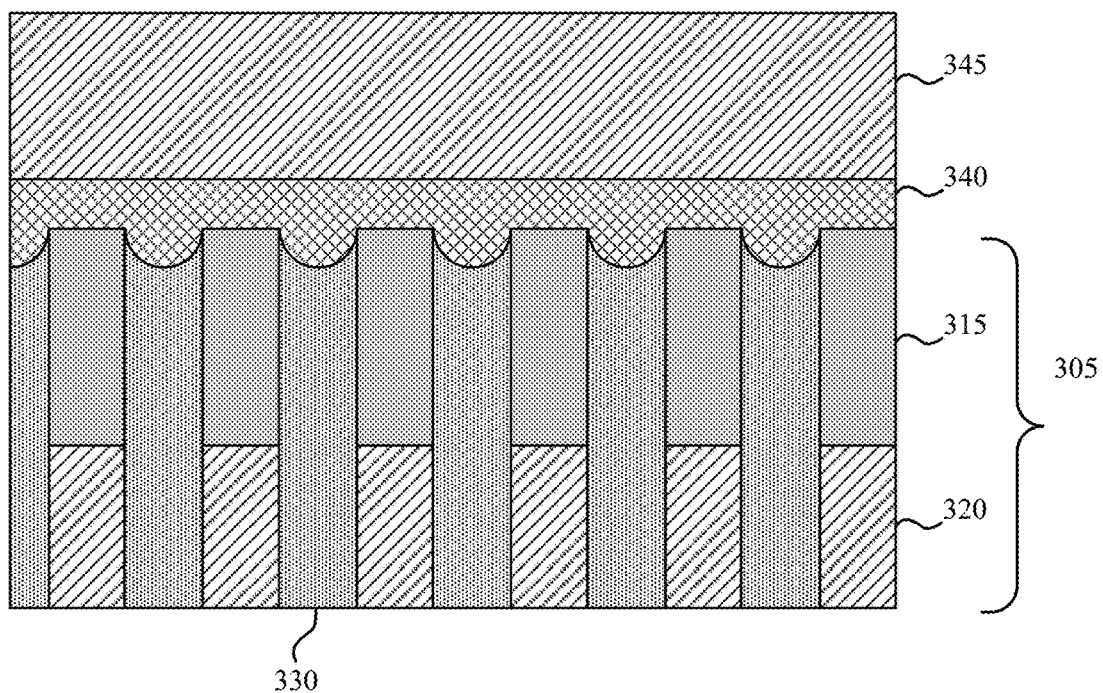

In FIG. 3G, a sixth processing step for forming raised lines is shown. In the processing step shown in FIG. 3G, a second conductive material 345 may be deposited above the material 340. FIG. 3G depicts the second conductive material 345 being deposited after the processing step shown in and described with reference to FIG. 3E (e.g., a portion of the material 340 remains above a top surface of the memory cell material 315). However, in some examples (not shown), the second conductive material may be deposited after the processing step shown in and described with reference to FIG. 3F (e.g., a top surface of the material 340 may be co-planar with a top surface of the memory cell material 315).

In some examples, the second conductive material 345 may be a same material as the conductive material 320. That is, the second conductive material 345 may be or may include one or more conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

Additionally or alternatively, the second conductive material 345 may be in contact with at least a portion of the horizontal surface (e.g., at the top of the material 340 and/or the memory cell material 315), and may be subsequently formed into one or more bit lines. In some cases, the second conductive material 345 may be associated with a faster etch rate than the material 340 (i.e., the second conductive material 345 may be softer than the material 340) during a subsequent etch process used to form second raised lines.

Figure 3H:
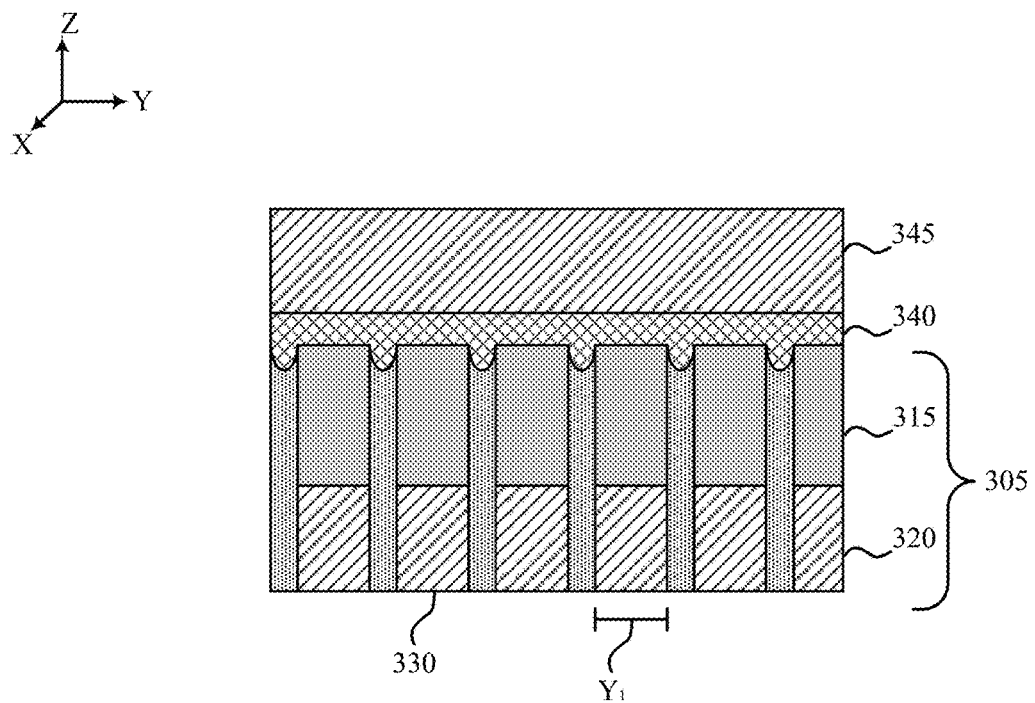

FIG. 3H illustrates a second conductive material 345 and a material 340 deposited over a plurality of raised lines 305. The first raised lines 305 may be formed according to the techniques described with reference to FIG. 3A, and the second conductive material 345 and the material may be deposited according to the techniques described with reference to FIGS. 3D, 3E, and 3G. Additionally or alternatively, FIG. 3H may illustrate a portion of the material 340 remaining above the memory cell material 315. Thus, in some examples, the material 340 shown in FIG. 3H may be or may represent an electrically conductive material and/or a thermally conductive material (e.g., as described with reference to FIG. 3E).

FIG. 3H may be an illustrative example of the plurality of raised lines 305 having a dimension (e.g., a width) $Y_1$ in the second direction (e.g., in the "Y" direction). In some examples, the dimension $Y_1$ may represent a relatively wide line (e.g., a line having a relatively wide dimension in the "Y" direction). Thus FIG. 3H may illustrate a plurality of wide (e.g., relatively wide) first raised lines 305. However, as described herein, the width of each first raised line 305 may vary after performing a first cut. Thus for illustrative purposes, FIG. 3H illustrates each first raised line 305 having a relatively similar width.

Due to the dimension $Y_1$ being relatively wide, the channels (e.g., channels 325 as described with reference to FIGS. 3A and 3B) may be relatively narrow. Accordingly, the dished areas between each raised line 305 may be relatively shallow. Thus, wider raised lines 305 in the second direction may result in less material 340 being deposited between each raised line 305. Due to the properties of the material 340 (e.g., due to the etch rate associated with the material 340), less material 340 between each raised line 305 may result in relatively thinner second lines when a second cut occurs in a second direction. Stated another way, the gap between raised lines and thus the depth of the recesses may be inversely proportional to the width of the raised lines, and thus the amount of material 340 present when the second cut occurs may also be inversely proportional to the width of the raised lines. Further, because the gaps created by the second cut may be inversely proportional to the amount of material 340 present when the second cut occurs, the width of the raised lines in the first direction may be directly proportional to the amount of material 340 present when the second cut occurs. Accordingly, the width of the raised lines in the first direction may be inversely proportional to the dimension $Y_1$ (e.g., inversely proportional to the width of the raised lines in the second direction). Thus, as described herein, the deposition of the material 340 may ultimately result in areas of intersection between the raised lines in the first direction and the raised lines in the second direction having more uniform area. Hence, in a memory application, as one example, memory cells across multiple tiles within a memory die, multiple memory dies, and/or multiple wafers having more uniform area.

Figure 3I:
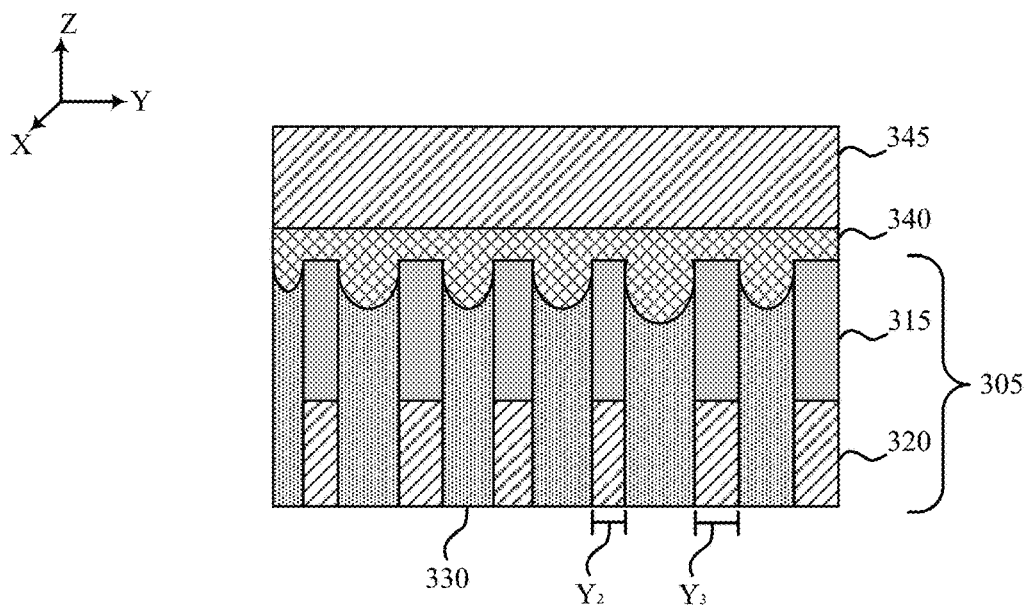

FIG. 3I illustrates a second conductive material 345 and a material 340 deposited over a plurality of raised lines 305. The first raised lines 305 may be formed according to the techniques described with reference to FIG. 3A, and the second conductive material 345 and the material may be deposited according to the techniques described with reference to FIGS. 3D, 3E, and 3G. Additionally or alternatively, FIG. 3I may illustrate a portion of the material 340 remaining above the memory cell material 315. Thus, in some examples, the material 340 shown in FIG. 3I may be or may represent an electrically conductive material and/or a thermally conductive material (e.g., as described with reference to FIG. 3E).

FIG. 3I may be an illustrative example of the plurality of raised lines 305 having different dimensions (widths) in the second direction (e.g., in the "Y" direction). For example, one first raised line 305 may have dimension $Y_2$ in the third direction and a one first raised line 305 may have dimension $Y_3$ in the third direction. In some examples, dimension $Y_2$ may be narrower than dimension $Y_3$ due to the fabrication techniques used when making the first cut (e.g., due to process imperfections or variability associated with the techniques described with reference to FIG. 3A). As described herein, such differences between widths of first raised lines 305 may exist between individual tiles of a memory die, between different memory dies of a same wafer, and/or between memory dies of different wafers. Thus FIG. 3I may illustrate a plurality first raised lines 305 having different widths.

Due to each raised line 305 having a different width (e.g., due to $Y_2$ being relatively narrow compared to $Y_3$) the width of the channels (e.g., channels 325 as described with reference to FIGS. 3A and 3B) between each raised line 305 may vary. Accordingly, the dished areas between each raised line 305 may vary. As described herein, wider raised lines 305 in the second direction may result in less material 340 being deposited between each raised line 305 and thinner raised lines 305 in the second direction may result in more material 340 being deposited between each raised line 305. Due to the properties of the material 340 (e.g., due to the etch rate associated with the material 340) less material 340 between each raised line 305 may result in relatively thinner second lines when a second cut occurs and more material 340 between each raised line 305 may result in relatively thicker second lines when a second cut occurs. Thus, as described herein, the deposition of the material 340 may ultimately result in a width of a second cut being inversely proportional to a width of a respective first cut. Stated another way, the deposition of the material 340 may result in each memory cell in a tile of a memory die, each memory cell in a memory die, and/or each memory cell in a wafer having more uniform area.

Figure 3J:
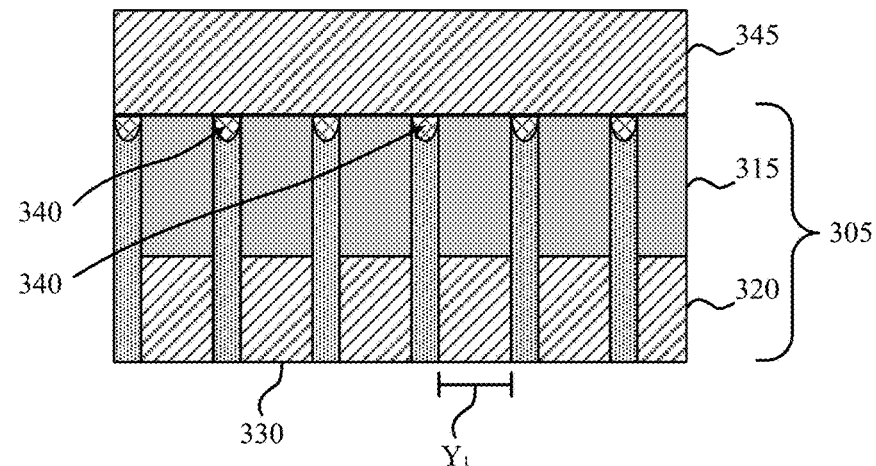

FIG. 3J illustrates an alternative example of a second conductive material 345 and a material 340 deposited over a plurality of raised lines 305. The first raised lines 305 may be formed according to the techniques described with reference to FIG. 3A, and the second conductive material 345 and the material may be deposited according to the techniques described with reference to FIGS. 3D, 3E, and 3G. Additionally or alternatively, FIG. 3J may illustrate a top surface of the material 340 being level (e.g., co-planar) with a top surface of the memory cell material 315. Thus, in some examples, the material 340 shown in FIG. 3J may be or may represent a dielectric material and/or a thermally conductive material (e.g., as described with reference to FIG. 3F).

FIG. 3J may be an illustrative example of the plurality of raised lines 305 having a dimension $Y_1$ in the second direction (e.g., in the "Y" direction). In some examples, the dimension $X_1$ may represent a relatively wide dimension. Thus FIG. 3J may illustrate a plurality of wide (e.g., relatively wide) first raised lines 305. However, as described herein, the width of each first raised line 305 may vary after performing a first cut. Thus for illustrative purposes, FIG. 3J illustrates each first raised line 305 having a relatively similar width.

Due to the dimension $X_1$ being relatively wide, the channels (e.g., channels 325 as described with reference to FIGS. 3A and 3B) may be relatively narrow. Accordingly, the dished areas between each raised line 305 may be relatively shallow. Thus, wider raised lines 305 in the second direction may result in less material 340 being deposited between each raised line 305. Due to the properties of the material 340 (e.g., due to the etch rate associated with the material 340) less material 340 between each raised line 305 may result in relatively thinner second lines when a second cut occurs in a second direction. Stated another way, the gap between raised lines and thus the depth of the recesses may be inversely proportional to the width of the raised lines, and thus the amount of material 340 present when the second cut occurs may also be inversely proportional to the width of the raised lines. Further, because the gaps created by the second cut may be inversely proportional to the amount of material 340 present when the second cut occurs, the width of the raised lines in the first direction may be directly proportional to the amount of material 340 present when the second cut occurs. Accordingly, the width of the raised lines in the first direction may be inversely proportional to the dimension $X_1$ (e.g., inversely proportional to the width of the raised lines in the second direction). Thus, as described herein, the deposition of the material 340 may ultimately result in areas of intersection between the raised lines in the first direction and the raised lines in the second direction having more uniform area. Hence, in a memory application, as one example, memory cells across multiple tiles within a memory die, multiple memory dies, and/or multiple wafers having more uniform area.

Figure 3K:
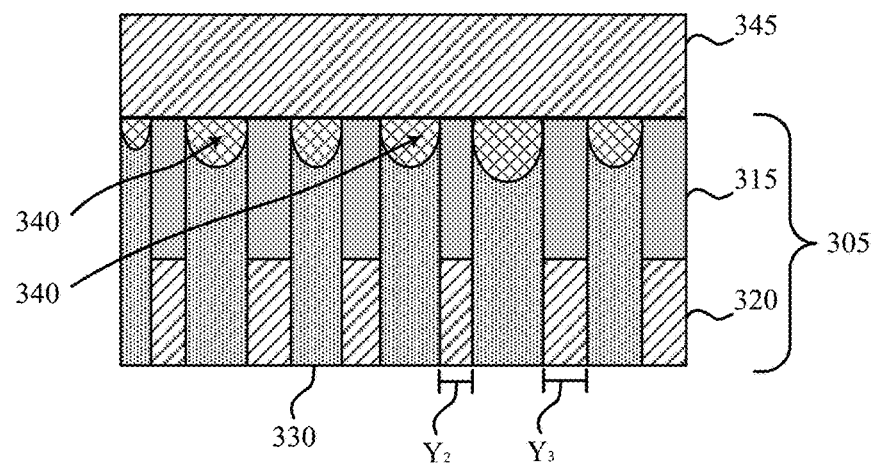

FIG. 3K illustrates an alternative example of a second conductive material 345 and a material 340 deposited over a plurality of raised lines 305. The first raised lines 305 may be formed according to the techniques described with reference to FIG. 3A, and the second conductive material 345 and the material may be deposited according to the techniques described with reference to FIGS. 3D, 3E, and 3G. Additionally or alternatively, FIG. 3K may illustrate a top surface of the material 340 being level (e.g., co-planar) with a top surface of the memory cell material 315. Thus, in some examples, the material 340 shown in FIG. 3K may be or may represent a dielectric material and/or a thermally conductive material (e.g., as described with reference to FIG. 3F).

FIG. 3K may be an illustrative example of the plurality of raised lines 305 having different dimensions (widths) in the second direction (e.g., in the "Y" direction). For example, one first raised line 305 may have dimension $Y_2$ in the second direction and one first raised line 305 may have dimension $Y_3$ in the second direction. In some examples, dimension $Y_2$ may be narrower than dimension $Y_3$ due to the fabrication techniques used when making the first cut (e.g., due to process imperfections or variability associated with the techniques described with reference to FIG. 3A). As described herein, such differences between widths of first raised lines 305 may exist between individual tiles of a memory die, between different memory dies of a same wafer, and/or between memory dies of different wafers. Thus FIG. 3K may illustrate a plurality first raised lines 305 having different widths.

Due to each raised line 305 having a different width (e.g., due to $X_2$ being relatively narrow compared to $X_3$) the width of the channels (e.g., channels 325 as described with reference to FIGS. 3A and 3B) between each raised line 305 may vary. Accordingly, the dished areas between each raised line 305 may vary. As described herein, wider raised lines 305 in the second direction may result in less material 340 being deposited between each raised line 305 and thinner raised lines 305 in the second direction may result in more material 340 being deposited between each raised line 305. Due to the properties of the material 340 (e.g., due to the etch rate associated with the material 340) less material 340 between each raised line 305 may result in relatively thinner second lines when a second cut occurs and more material 340 between each raised line 305 may result in relatively thicker second lines when a second cut occurs. Thus, as described herein, the deposition of the material 340 may ultimately result in a width of a second cut being inversely proportional to a width of a respective first cut. Stated another way, the deposition of the material 340 may result in each memory cell in a tile of a memory die, each memory cell in a memory die, and/or each memory cell in a wafer having more uniform area.

Figure 3L:
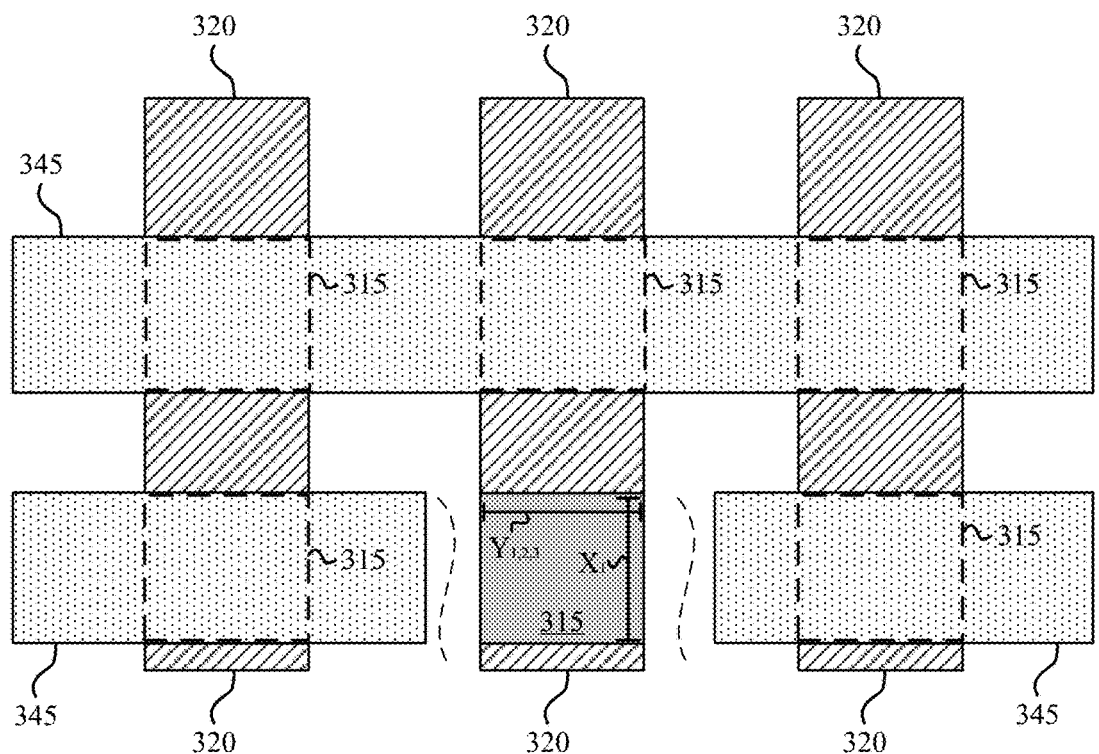

In FIG. 3L, a seventh processing step for forming raised lines is shown. In the processing step shown in FIG. 3L, a first cut may have been previously made in a stack of materials to form a plurality of first raised lines 305. Subsequently, a material 340 may have been deposited over the first plurality of raised lines 305, and a second conductive material 345 may have been deposited over the material 340. Accordingly, FIG. 3L may illustrate a second removal of materials (e.g., a second cut) in a second direction (e.g., in the "Y" direction) to form a plurality of second raised lines extending in the second direction. In some examples, forming a plurality of second raised lines may result in a plurality of pillars, and the processing step illustrated in FIG. 3L may result in a same or similar structure as the memory array 200 as shown in and described with reference to FIG. 2.

For example, each pillar may include a memory cell located between a first conductive material 320 (e.g., a word line) and a second conductive material 345 (e.g., a bit line). In some examples, the first conductive material 320 and the second conductive material 345 may a same material. Additionally or alternatively, the term "memory cell" may refer to the memory cell material 315 being cut in a first direction (e.g., as described with reference to FIG. 3A) and in a second direction (e.g., as described with reference to FIG. 3L). Thus each memory cell may include the memory cell material 315 and may have a first width (e.g., in the "Y" direction) that is based the first cut, a second width (e.g., in the "X" direction) that is based on the second cut, and a third dimension (height) (e.g., in the "Z" direction) that is based on depositing the memory cell material 315 in the stack.

As described herein, the first cut may result in each first raised line 305 having a same, similar, or varying dimension (e.g., a width). Accordingly, an amount of material 340 (e.g., as described with reference to FIGS. 3E-3K) located in the recessed regions between each first raised line 305 may be based on a width of each respective first raised line 305. Though the material 340 is not shown in FIG. 3L, the material 340 may be located between each respective memory cell (and under the second conductive material 345) in the second direction (e.g., in the "Y" direction). Due to one or more properties of the material 340 (e.g., due to an etch rate associated with the material 340), a dimension of each memory cell formed after making the second cut (e.g., the cut in the "Y" direction) may be inversely proportional to the dimension of the memory cell material 315 after making the first cut (e.g., the cut in the "X" direction).

As discussed herein, the material 340 may be selected based on its associated etch rate (e.g., based on the chemistry of the material relative to the chemistry of the etchant). For example, the material 340 may be selected such that it is associated with a slower etch rate than the other materials in the stack when forming the second raised lines (during the second cut). Selecting the material 340 to have a slower etch rate than the remaining materials may affect the width of the lines formed by the second cut. For example, a same type and/or a same amount of etchant may be used to conduct the second cut when the material 340 is present. Stated another way, the same etch process may be used to form the second lines regardless of whether the material 340 is present. Because the material 340 is present, it must be etched through before the second lines are fully formed.

Due to a finite amount of etchant being used to form the second lines, a width of the second channels (not shown) may be based on an amount of material 340 to be etched. Accordingly, if less material 340 is located between the first raised lines 305 (e.g., if the first raised lines 305 are relatively wider), a lesser amount of etchant is needed to etch the material 340, resulting in a greater amount of etchant used to form the resulting channels. A greater amount of etchant used to form the resulting channels may result in wider channels, which may result in relatively thinner second raised lines. Conversely, if more material 340 is located between the first raised lines 305 (e.g., if the first raised lines 305 are relatively thinner), a greater amount of etchant is needed to etch the material 340, resulting in a lesser amount of etchant used to form the resulting channels. A lesser amount of etchant used to form the resulting channels may result in narrower channels, which may result in relatively wider second raised lines.

By way of example, FIG. 3L illustrates a memory cell having a first width $Y_{1, 2, 3}$ and a second width $X_1$. The first width $Y_{1, 2, 3}$ may represent any one of the dimensions $Y_1$, $Y_2$, and/or $Y_3$ as described with reference to FIGS. 3H-3K. For example, the first cut may result in the memory cell material 315 having a first width of $Y_1$ (e.g., a relatively wider dimension). The dimension $Y_1$ may result in less material 340 being located adjacent to the respective raised line 305. As described herein, a lesser amount of etchant may be needed to etch the material 340, which may result in the memory cell having a relatively wider second width of $X_1$. By employing this process with respect to each memory cell shown in FIG. 3L (or each memory cell in a memory die and/or wafer), each memory cell may comprise a more-uniform (e.g., a similar) area.

Additionally or alternatively, a determination of a width of each first raised line 305 may be made before the second cut is performed. Based on the determination, one or more conditions of the etch process (e.g., of the second cut) may be altered. In some examples, an etchant type, a temperature of the etchant used, and/or a rate at which the etchant is applied (e.g., to the material 340) may be altered in order to achieve a more-uniform area of each memory cell. For example, after the first cut, a determination may be made that one or more first raised lines 305 may be relatively wide. The determination may result in an etchant type, a temperature of the etchant, and/or a rate at which the etchant is applied during the second cut being altered (e.g., adjusted relative to a corresponding default or baseline). The determination and subsequent adjustment may affect one or more respective dimensions resulting from the second cut, which may result in the memory cells having a more-uniform area. In some examples, the determination may be made on an array-to-array basis, on a tile-to-tile basis, and/or on a wafer-to-wafer basis. Accordingly, in some examples, the determination may be made in addition to the processing steps for making the second cut as described herein (e.g., in addition to selecting the material 340). Thus determining a width of each raised line may be a design choice employed in order to achieve more consistent results across multiple tiles, multiple arrays, and/or multiple wafers.

Figure 4:
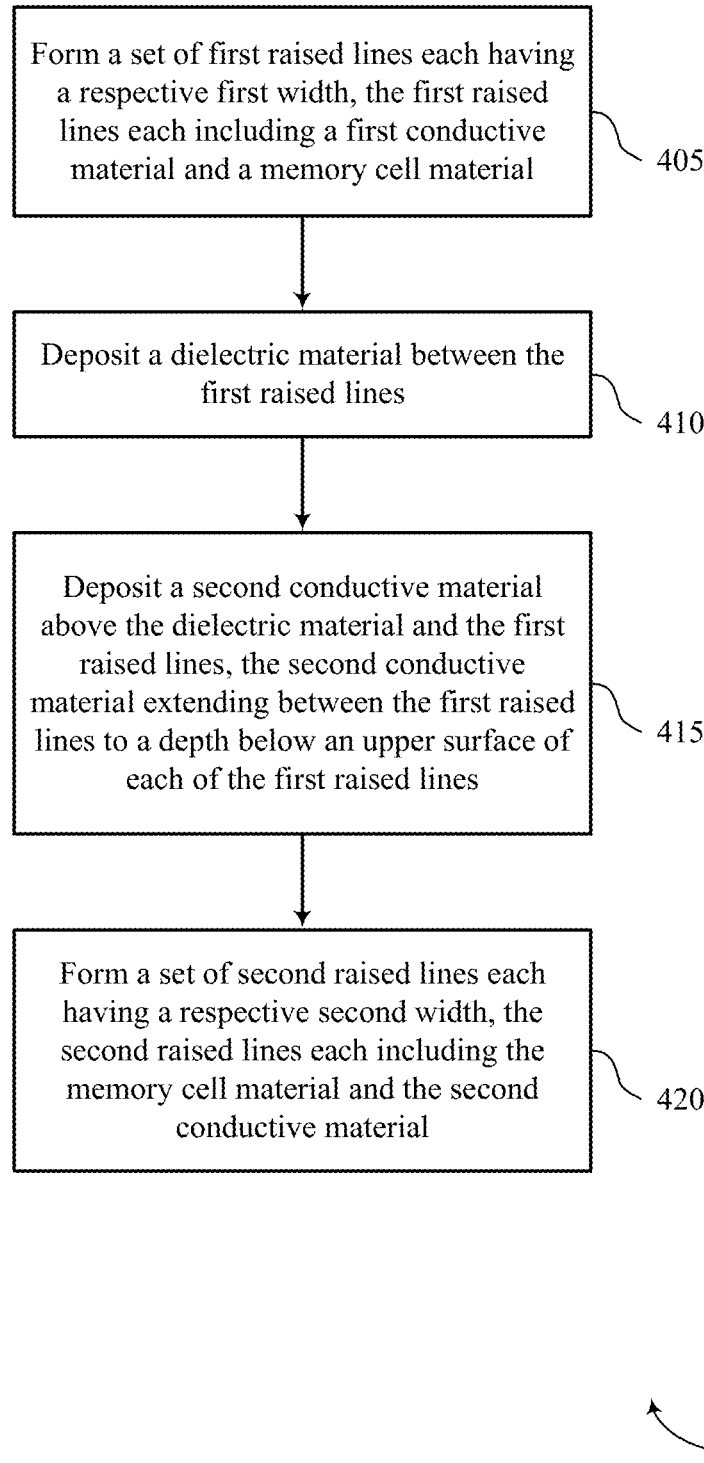
FIGS. 4 through 9 show flowcharts illustrating a method or methods that support dimension control for raised lines in accordance with examples as disclosed herein.

FIG. 4 shows a flowchart illustrating a method or methods 400 that support dimension control for raised lines in accordance with aspects of the present disclosure. The operations of method 400 may be implemented by the methods described herein, for example with reference to FIGS. 3A-3L.

At 405, a set of first raised lines each having a respective first width may be formed. In some examples, the set of raised lines may each include a first conductive material and a memory cell material. The operations of 405 may be performed according to the methods described herein, for example with reference to FIGS. 3A-3L.

At 410, a dielectric material may be deposited between the first raised lines. The operations of 410 may be performed according to the methods described herein, for example with reference to FIGS. 3A-3L.

At 415, a second conductive material may be deposited above the dielectric material and the first raised lines. In some examples, the second conductive material may extend between the first raised lines to a depth below an upper surface of each of the first raised lines. The operations of 415 may be performed according to the methods described herein, for example with reference to FIGS. 3A-3L.

At 420, a set of second raised lines each having a respective second width may be formed. In some examples, the set of second raised lines may each including the memory cell material and the second conductive material. In some examples, forming the plurality of second raised lines may include using an etch process configured to etch the memory cell material at a first etch rate and the second memory cell material at a second etch rate that is different than the first etch rate. In some examples, the respective second width is based at least in part on the depth of the second conductive material. The operations of 420 may be performed according to the methods described herein, for example with reference to FIGS. 3A-3L.

In some examples of the method 400 and the apparatus described herein, the second etch rate may be slower than the first etch rate, and the respective second width may be inversely proportional to the respective first width. In some examples, the method and the apparatus described herein may include forming a set of recesses in the dielectric material between the first raised lines by polishing the upper surface of the first raised lines and the dielectric material. In some examples of the method and the apparatus described herein, depositing the second conductive material may include depositing the second conductive material in the set of recesses, where each of the set of recesses extends to the depth below the upper surface of the first raised lines.

In some examples of the method and the apparatus described herein, each of the set of recesses may include a curved upper surface, and the deposited second conductive material may include curved lower surfaces in contact with curved upper surfaces of corresponding recesses. In some examples of the method and the apparatus described herein, polishing the upper surface of the first raised lines may include removing a hardmask material from above the memory cell material, and dishing may occur between each of the first raised lines based on removing the hardmask material. In some examples, the method and the apparatus described herein may include polishing the second conductive material, where a portion of the second conductive material remains above the upper surface of the first raised lines after polishing the second conductive material.

In some examples, the method and the apparatus described herein may include polishing the second conductive material until an upper surface of at least one portion of the second conductive material may be level with the upper surface of at least one first raised line. In some examples, the method and the apparatus described herein may include depositing a second layer of the first conductive material above the second conductive material before forming the set of second raised lines, where the set of second raised lines each include a portion of the second layer of the first conductive material.

In some examples of the method and the apparatus described herein, the second conductive material may include an electrically conductive material, a thermally conductive material, or a combination thereof. In some examples of the method 400 and the apparatus described herein, the set of first raised lines may extend in a first direction and the set of second raised lines may extend in a second direction that may be orthogonal to the first direction.

Figure 5:
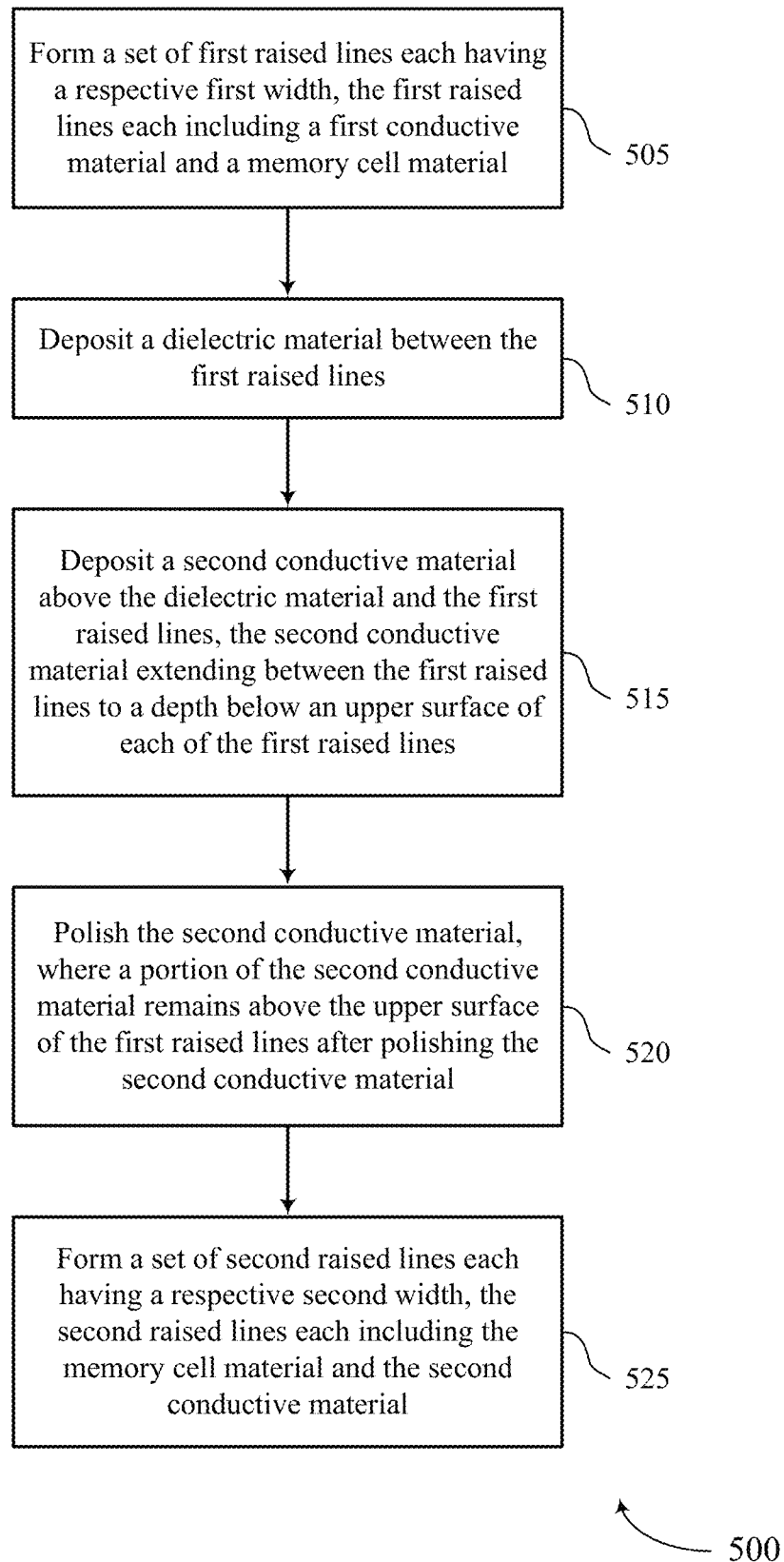

FIG. 5 shows a flowchart illustrating a method or methods 500 that support dimension control for raised lines in accordance with aspects of the present disclosure. The operations of method 500 may be implemented by the methods described herein, for example with reference to FIGS. 3A-3L.

At 505, a set of first raised lines each having a respective first width may be formed. In some examples, the set of raised lines may each include a first conductive material and a memory cell material. The operations of 505 may be performed according to the methods described herein, for example with reference to FIGS. 3A-3L.

At 510, a dielectric material may be deposited between the first raised lines. The operations of 510 may be performed according to the methods described herein, for example with reference to FIGS. 3A-3L.

At 515, a second conductive material may be deposited above the dielectric material and the first raised lines. In some examples, the second conductive material may extend between the first raised lines to a depth below an upper surface of each of the first raised lines. The operations of 520 may be performed according to the methods described herein, for example with reference to FIGS. 3A-3L.

At 520, the second conductive material may be polished. In some examples the second conductive material may be polished such that a portion of the second conductive material remains above the upper surface of the first raised lines. The operations of 520 may be performed according to the methods described herein, for example with reference to FIGS. 3A-3L.

At 525, a set of second raised lines each having a respective second width may be formed. In some examples, the set of second raised lines may each including the memory cell material and the second conductive material. In some examples, forming the plurality of second raised lines may include using an etch process configured to etch the memory cell material at a first etch rate and the second memory cell material at a second etch rate that is different than the first etch rate. In some examples, the respective second width is based at least in part on the depth of the second conductive material. The operations of 525 may be performed according to the methods described herein, for example with reference to FIGS. 3A-3L.

Figure 6:
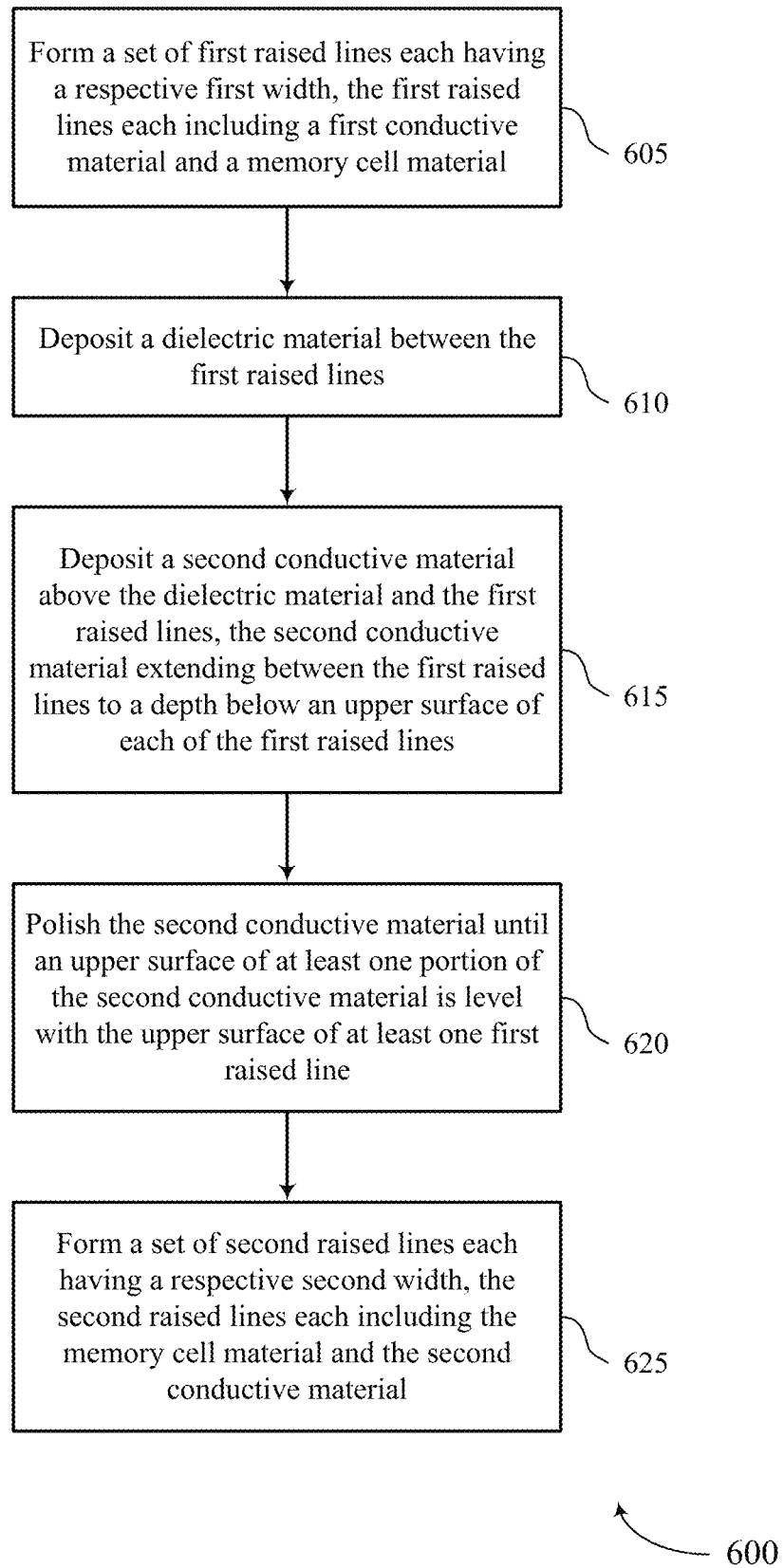

FIG. 6 shows a flowchart illustrating a method or methods 600 that support dimension control for raised lines in accordance with aspects of the present disclosure. The operations of method 600 may be implemented by the methods described herein, for example with reference to FIGS. 3A-3L.

At 605, a set of first raised lines each having a respective first width may be formed. In some examples, the set of raised lines may each include a first conductive material and a memory cell material. The operations of 605 may be performed according to the methods described herein, for example with reference to FIGS. 3A-3L.

At 610, a dielectric material may be deposited between the first raised lines. The operations of 610 may be performed according to the methods described herein, for example with reference to FIGS. 3A-3L.

At 615, a second conductive material may be deposited above the dielectric material and the first raised lines. In some examples, the second conductive material may extend between the first raised lines to a depth below an upper surface of each of the first raised lines. The operations of 615 may be performed according to the methods described herein, for example with reference to FIGS. 3A-3L.

At 620, the second conductive material may be polished until an upper surface of at least one portion of the second conductive material is level with the upper surface of at least one first raised line. The operations of 620 may be performed according to the methods described herein, for example with reference to FIGS. 3A-3L.

At 625, a set of second raised lines each having a respective second width may be formed. In some examples, the set of second raised lines may each including the memory cell material and the second conductive material. In some examples, forming the plurality of second raised lines may include using an etch process configured to etch the memory cell material at a first etch rate and the second memory cell material at a second etch rate that is different than the first etch rate. In some examples, the respective second width is based at least in part on the depth of the second conductive material. The operations of 625 may be performed according to the methods described herein, for example with reference to FIGS. 3A-3L.

Figure 7:
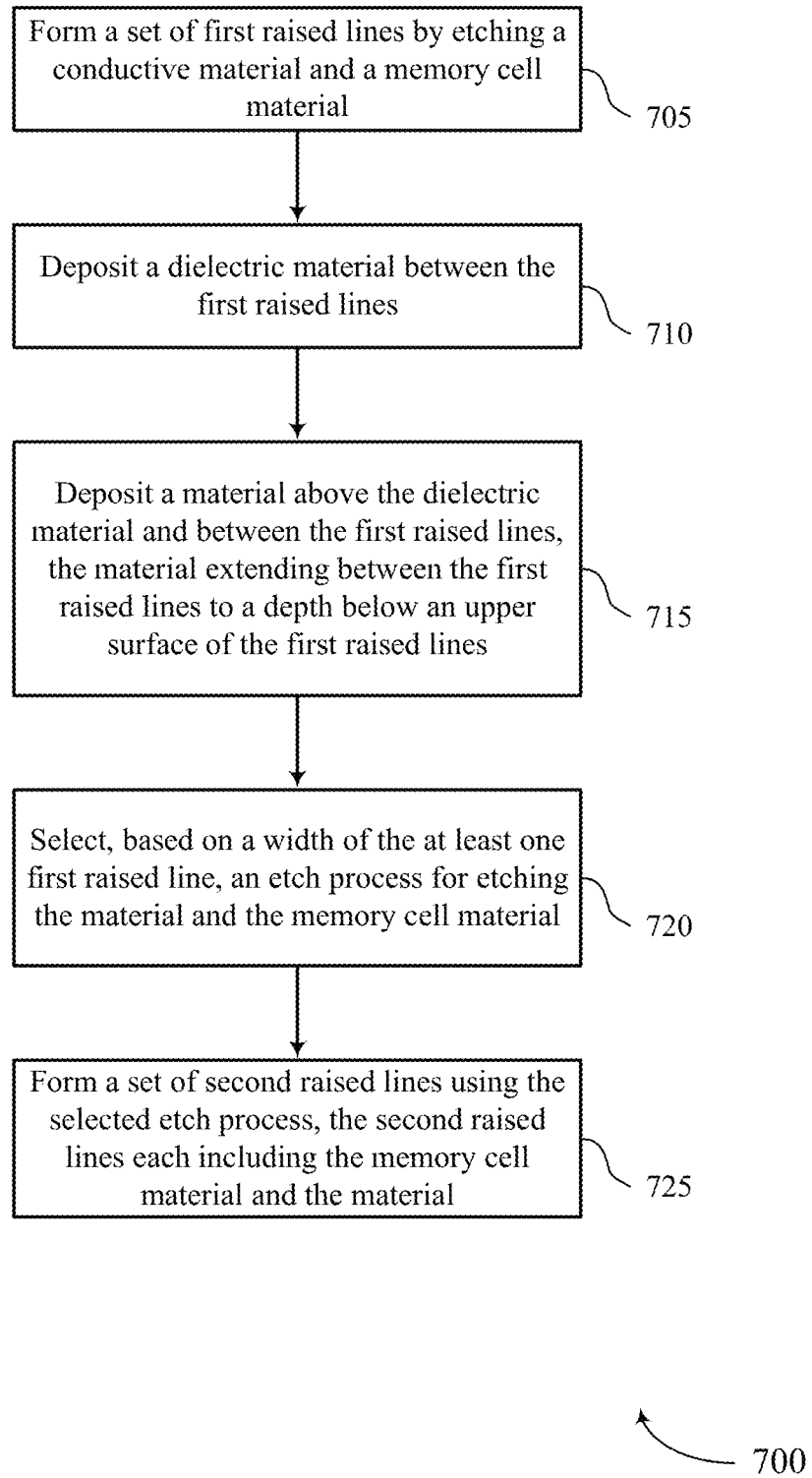

FIG. 7 shows a flowchart illustrating a method or methods 700 that support dimension control for raised lines in accordance with aspects of the present disclosure. The operations of method 700 may be implemented by the methods described herein, for example with reference to FIGS. 3A-3L.

At 705, a set of first raised lines may be formed by etching a conductive material and a memory cell material. The operations of 705 may be performed according to the methods described herein, for example with reference to FIGS. 3A-3L.

At 710, a dielectric material may be deposited between the first raised lines. The operations of 710 may be performed according to the methods described herein, for example with reference to FIGS. 3A-3L.

At 715, a material may be deposited above the dielectric material and between the first raised lines, the material extending between the first raised lines to a depth below an upper surface of the first raised lines. The operations of 715 may be performed according to the methods described herein, for example with reference to FIGS. 3A-3L.

At 720, an etch process for etching the material and memory cell material may be selected based on a width of the at least one first raised line. The operations of 720 may be performed according to the methods described herein, for example with reference to FIGS. 3A-3L.

At 725, a set of second raised lines may be formed, using the selected etch process, that include the memory cell material and the material. The operations of 725 may be performed according to the methods described herein, for example with reference to FIGS. 3A-3L.

In some examples, the method and the apparatus described herein may include removing a portion of the material above the dielectric material before forming the set of second raised lines. In some examples, the method and the apparatus described herein may include removing the material until the first raised lines may be exposed before forming the set of second raised lines. In some examples, the method and the apparatus described herein may include depositing a second layer of the conductive material above the material, where forming the set of second raised lines occurs after depositing the second layer of the conductive material.

In some examples of the method and the apparatus described herein, selecting the etch process may include determining the width of at the least one first raised line, and selecting, based on the width of the at least one first raised line, a duration associated with the etch process, a temperature of the etch process, an amount of etchant used in the etch process, an etchant used in the etch process, or any combination thereof. In some examples of the method and the apparatus described herein, a width of the second raised lines may be based on the etch process, a composition of the material, the depth of the material, or any combination thereof. In some examples of the method and the apparatus described herein, the depth below the upper surface of the first raised lines may be based on the width of each first raised line.

Figure 8:
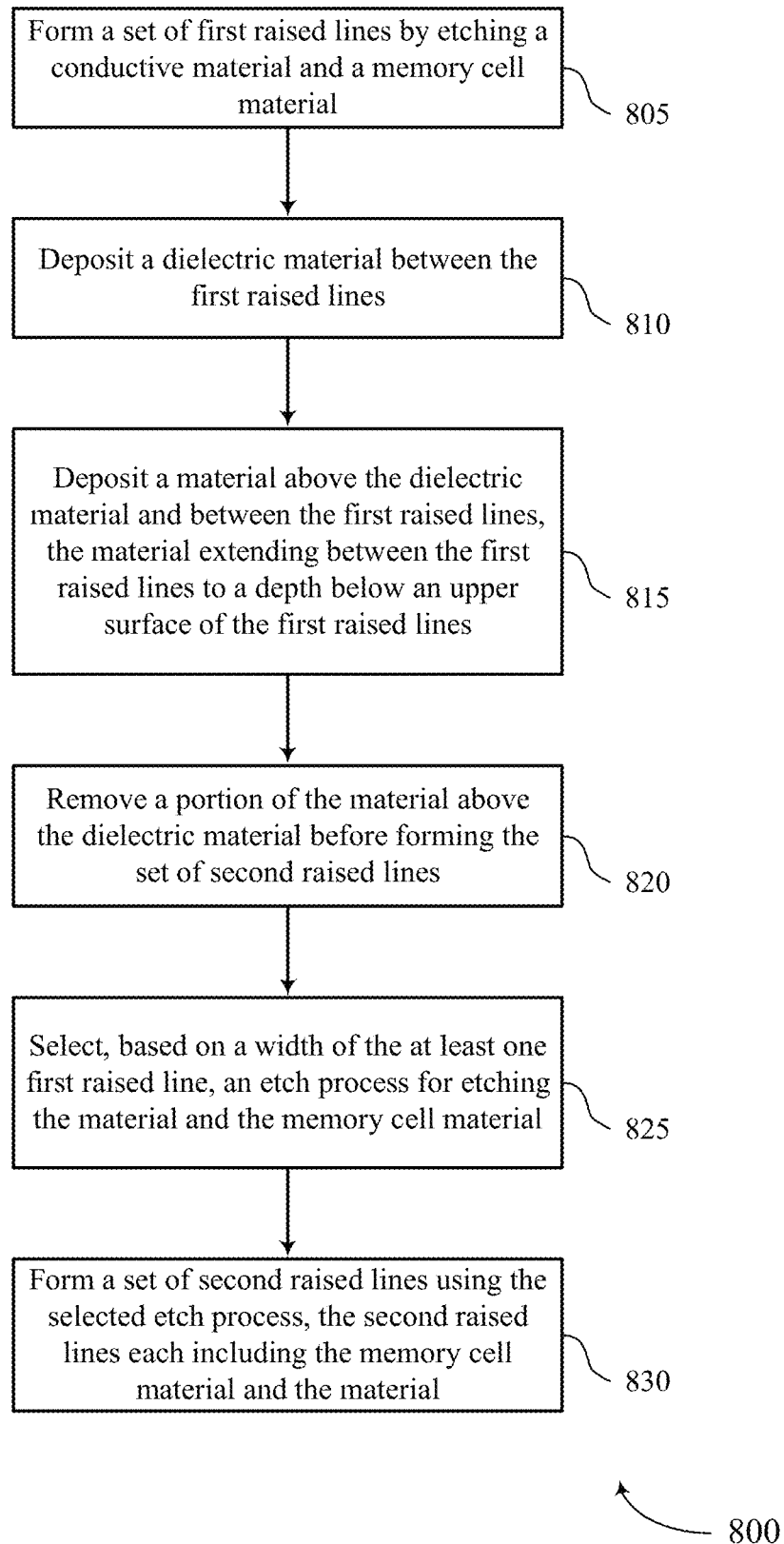

FIG. 8 shows a flowchart illustrating a method or methods 800 that support dimension control for raised lines in accordance with aspects of the present disclosure. The operations of method 800 may be implemented by the methods described herein, for example with reference to FIGS. 3A-3L.

At 805, a set of first raised lines may be formed by etching a conductive material and a memory cell material. The operations of 805 may be performed according to the methods described herein, for example with reference to FIGS. 3A-3L.

At 810, a dielectric material may be deposited between the first raised lines. The operations of 810 may be performed according to the methods described herein, for example with reference to FIGS. 3A-3L.

At 815, a material may be deposited above the dielectric material and between the first raised lines, the material extending between the first raised lines to a depth below an upper surface of the first raised lines. The operations of 815 may be performed according to the methods described herein, for example with reference to FIGS. 3A-3L.

At 820, the memory array may remove a portion of the material above the dielectric material before forming the set of second raised lines. The operations of 820 may be performed according to the methods described herein, for example with reference to FIGS. 3A-3L.

At 825, an etch process for etching the material and the memory cell material may be selected based on a width of the at least one first raised line. The operations of 825 may be performed according to the methods described herein, for example with reference to FIGS. 3A-3L.

At 830, a set of second raised lines may be formed, using the selected etch process, that include the memory cell material and the material. The operations of 830 may be performed according to the methods described herein, for example with reference to FIGS. 3A-3L.

Figure 9:
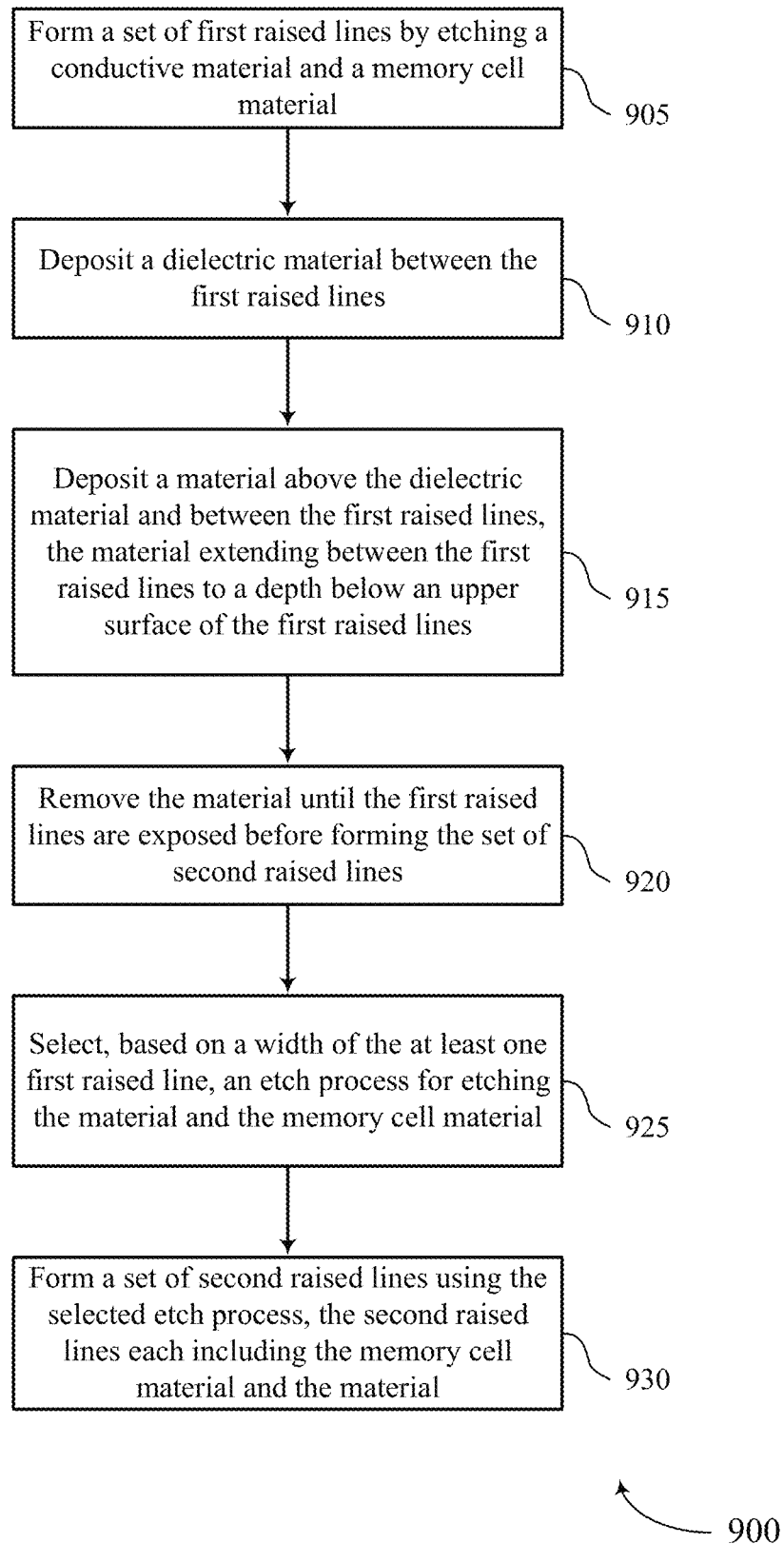

FIG. 9 shows a flowchart illustrating a method or methods 900 that support dimension control for raised lines in accordance with aspects of the present disclosure. The operations of method 900 may be implemented by the methods described herein, for example with reference to FIGS. 3A-3L.

At 905, a set of first raised lines may be formed by etching a conductive material and a memory cell material. The operations of 905 may be performed according to the methods described herein, for example with reference to FIGS. 3A-3L.

At 910, a dielectric material may be deposited between the first raised lines. The operations of 910 may be performed according to the methods described herein, for example with reference to FIGS. 3A-3L.

At 915, a material may be deposited above the dielectric material and between the first raised lines, the material extending between the first raised lines to a depth below an upper surface of the first raised lines. The operations of 815 may be performed according to the methods described herein, for example with reference to FIGS. 3A-3L.

At 920, the material may be removed until the first raised lines are exposed before forming the set of second raised lines. The operations of 920 may be performed according to the methods described herein, for example with reference to FIGS. 3A-3L.

At 925, an etch process for etching the material and the memory cell material may be selected based on a width of the at least one first raised line. The operations of 925 may be performed according to the methods described herein, for example with reference to FIGS. 3A-3L.

At 930, a set of second raised lines may be formed, using the selected etch process, that include the memory cell material and the material. The operations of 930 may be performed according to the methods described herein, for example with reference to FIGS. 3A-3L.

It should be noted that the methods described above describe possible implementations, and that the operations and the steps may be rearranged or otherwise modified and that other implementations are possible. Furthermore, aspects from two or more of the methods may be combined.

An apparatus is described. In some examples, the apparatus may include a first pillar comprising a first memory cell coupled with a first conductive line and a second conductive line that each comprise a first conductive material, second pillar comprising a second memory cell coupled with the second conductive line and a third conductive line that comprises the first conductive material, and a second conductive material below the second conductive line, at least a portion of the second conductive material extending below an upper surface of the first pillar and an upper surface of the second pillar at a location between the first pillar and the second pillar.

In some examples, the apparatus may include a dielectric material between the first pillar and the second pillar, wherein the portion of the second conductive material extends below at least a portion of the dielectric material. In some examples, the portion of the second conductive material has a first dimension equal to a distance between the first pillar and the second pillar and a second dimension equal to a width of the first memory cell, the second memory cell, or both. In some examples, the portion of the second conductive material comprises a lower surface that is rounded along the first dimension and linear along the second dimension.

In some examples, at least a portion of the second conductive material is located between the first pillar and the second conductive line and between the second pillar and the second conductive line. In some examples, the second conductive material has a first thickness above the first pillar and the second pillar and a second thickness between the first pillar and the second pillar, the second thickness greater than the first thickness. In some examples, an upper surface of the portion of the second conductive material is co-planar with the upper surface of the first pillar and the upper surface of the second pillar.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" used herein refers to a stratum or sheet of a geometrical structure. each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some cases, may be employed as an electrical contact to a memory cell or other component of a memory array. An electrode may include a trace, wire, conductive line (e.g., access line), conductive layer (e.g., within a memory cell stack), or the like that provides a conductive path between elements or components of memory array.

The term "photolithography," as used herein, may refer to the process of patterning using photoresist materials and exposing such materials using electromagnetic radiation. For example, a photoresist material may be formed on a base material by, for example, spin-coating the photoresist on the base material. A pattern may be created in the photoresist by exposing the photoresist to radiation. The pattern may be defined by, for example, a photo mask that spatially delineates where the radiation exposes the photoresist. Exposed photoresist areas may then be removed, for example, by chemical treatment, leaving behind the desired pattern. In some cases, the exposed regions may remain, and the unexposed regions may be removed.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    forming a plurality of first raised lines each having a respective first width, the plurality of first raised lines each comprising a first conductive material and a memory cell material;
    depositing a dielectric material between the plurality of first raised lines;
    depositing a second conductive material above the dielectric material and the plurality of first raised lines, the second conductive material extending between the plurality of first raised lines to a depth below an upper surface of each of the plurality of first raised lines, wherein the depth of the second conductive material is inversely proportional to the first width; and
    forming a plurality of second raised lines each having a respective second width, the plurality of second raised lines each comprising the memory cell material and the second conductive material, wherein:
        forming the plurality of second raised lines comprises using an etch process configured to etch the memory cell material at a first etch rate and the second conductive material at a second etch rate that is slower than the first etch rate; and
        the respective second width is directly proportional to the depth of the second conductive material and inversely proportional to the respective first width based at least in part on the etch process being configured to etch the memory cell material at the first etch rate and the second conductive material at the second etch rate that is slower than the first etch rate.

2. The method of claim 1, further comprising:
    forming a plurality of recesses in the dielectric material between the plurality of first raised lines by polishing the upper surface of the plurality of first raised lines and the dielectric material.

3. The method of claim 2, wherein depositing the second conductive material comprises:
    depositing the second conductive material in the plurality of recesses, wherein each of the plurality of recesses extends to the depth below the upper surface of the plurality of first raised lines.

4. The method of claim 3, wherein each of the plurality of recesses comprises a curved upper surface, and wherein the deposited second conductive material comprises curved lower surfaces in contact with curved upper surfaces of corresponding recesses.

5. The method of claim 2, wherein polishing the upper surface of the plurality of first raised lines comprises removing a hardmask material from above the memory cell material, and wherein dishing occurs between each of the plurality of first raised lines based at least in part on removing the hardmask material.

6. The method of claim 1, further comprising:
    polishing the second conductive material, wherein a portion of the second conductive material remains above the upper surface of the plurality of first raised lines after polishing the second conductive material.

7. The method of claim 1, further comprising:
    polishing the second conductive material until an upper surface of at least one portion of the second conductive material is level with the upper surface of at least one first raised line.

8. The method of claim 1, further comprising:
    depositing a second layer of the first conductive material above the second conductive material before forming the plurality of second raised lines, wherein the plurality of second raised lines each comprise a portion of the second layer of the first conductive material.

9. The method of claim 1, wherein the second conductive material comprises an electrically conductive material, a thermally conductive material, or a combination thereof.

10. The method of claim 1, wherein the plurality of first raised lines extend in a first direction and the plurality of second raised lines extend in a second direction that is orthogonal to the first direction.

11. A method, comprising:
    forming a plurality of first raised lines by etching a conductive material and a memory cell material;
    depositing a dielectric material between the plurality of first raised lines;
    depositing a material above the dielectric material and between the plurality of first raised lines, the material extending between the plurality of first raised lines to a depth below an upper surface of the plurality of first raised lines;
    selecting, based at least in part on a width of at least one first raised line of the plurality of first raised lines, an etch process for etching the material and the memory cell material, wherein the depth of the material is inversely proportional to the width, and wherein the selected etch process is configured to etch the memory cell material at a first etch rate and the material at a second etch rate that is slower than the first etch rate; and
    forming a plurality of second raised lines using the selected etch process, the plurality of second raised lines each having a respective second width and each comprising the memory cell material and the material, wherein the respective second width is directly proportional to the depth of the material and inversely proportional to the width based at least in part on the etch process being configured to etch the memory cell material at the first etch rate and the material at the second etch rate that is slower than the first etch rate.

12. The method of claim 11, further comprising:
    removing a portion of the material above the dielectric material before forming the plurality of second raised lines.

13. The method of claim 12, further comprising:
    removing the material until the plurality of first raised lines are exposed before forming the plurality of second raised lines.

14. The method of claim 11, further comprising:
    depositing a second layer of the conductive material above the material, wherein forming the plurality of second raised lines occurs after depositing the second layer of the conductive material.

15. The method of claim 11, wherein selecting the etch process comprises:
   determining the width of at the at least one first raised line; and
   selecting, based at least in part on the width of the at least one first raised line, a duration associated with the etch process, a temperature of the etch process, an amount of etchant used in the etch process, an etchant used in the etch process, or any combination thereof.

16. The method of claim 11, wherein the respective second width is based at least in part on the etch process, a composition of the material, or any combination thereof.

* * * * *